US00RE49225E

(19) United States
(12) Reissued Patent
Livshitz et al.

(10) Patent Number: US RE49,225 E
(45) Date of Reissued Patent: *Sep. 27, 2022

(54) STRUCTURED LOW-DENSITY PARITY-CHECK (LDPC) CODE

(71) Applicant: BlackBerry Limited, Waterloo (CA)

(72) Inventors: Michael Livshitz, Rockville, MD (US); Aleksandar Purkovic, Potomac, MD (US); Nina K. Burns, Clarksville, MD (US); Sergey Sukhobok, Rockville, MD (US); Muhammad Chaudhry, Gaithersburg, MD (US)

(73) Assignee: BlackBerry Limited, Waterloo (CA)

( * ) Notice: This patent is subject to a terminal disclaimer.

(21) Appl. No.: 16/938,158

(22) Filed: Jul. 24, 2020

Related U.S. Patent Documents

Reissue of:
(64) Patent No.: 8,301,975
Issued: Oct. 30, 2012
Appl. No.: 13/156,942
Filed: Jun. 9, 2011

U.S. Applications:
(60) Continuation of application No. 15/838,188, filed on Dec. 11, 2017, now Pat. No. Re. 48,212, which is a
(Continued)

(51) Int. Cl.
*H03M 13/00* (2006.01)
*H03M 13/11* (2006.01)
*H04L 1/00* (2006.01)

(52) U.S. Cl.
CPC ..... *H03M 13/118* (2013.01); *H03M 13/114* (2013.01); *H03M 13/116* (2013.01);
(Continued)

(58) Field of Classification Search
CPC ..... H03M 13/118; H03M 13/114; H03M 13/1188; H03M 13/6393; H03M 13/116;
(Continued)

(56) References Cited

U.S. PATENT DOCUMENTS 7,178,080 B2 2/2007 Hocevar
7,203,897 B2 4/2007 Blankenship et al.
(Continued)

FOREIGN PATENT DOCUMENTS

WO 2006039801 4/2006

OTHER PUBLICATIONS

Chung, et al., "Analysis of Sum-Product Decoding of Low-Density Parity-Check Codes Using a Gaussian Approximation," IEEE Transactions on Information Theory, vol. 47, No. 2, Feb. 2001, pp. 657-670,14 pages.
(Continued)

*Primary Examiner* — William H. Wood
(74) *Attorney, Agent, or Firm* — Fish & Richardson P.C.

(57) ABSTRACT

[A method for constructing a low-density parity-check (LDPC) code using a structured base parity check matrix with permutation matrix, pseudo-permutation matrix, or zero matrix as constituent sub-matrices; and expanding the structured base parity check matrix into an expanded parity check matrix. A method for constructing a LDPC code using a structured base parity check matrix $H=[H_d|H_p]$, $H_d$ is the data portion, and $H_p$ is the parity portion of the parity check matrix; the parity portion of the structured base parity check matrix is such so that when expanded, an inverse of the parity portion of the expanded parity check matrix is sparse; and expanding the structured base parity check matrix into an expanded parity check matrix. A method for encoding variable sized data by using the expanded LDPC code; and applying shortening, puncturing.] *System and method for operating a wireless device to encode data using low-density parity-check (LDPC) encoding is discussed. One example method includes: computing a number of modulated orthogonal frequency-division multiplexing (OFDM) symbols for transmitting the data; computing a number of shortening bits; distributing the number of shortening bits*
(Continued)

*over the at least one LDPC codeword; computing a number of puncturing bits for the at least one LDPC codeword; distributing the number of puncturing bits over the at least one LDPC codeword; determining a criterion using at least one of the number of shortening bits and the number of puncturing bits; if the criterion is met, increasing the number of modulated OFDM symbols and recalculating the number of puncturing bits; generating the encoded data using the number of shortening bits, the number of puncturing bits, and the at least one LDPC codeword; and transmitting the encoded data.*

12 Claims, 19 Drawing Sheets

Related U.S. Application Data division of application No. 14/527,483, filed on Oct. 29, 2014, now Pat. No. Re. 46,692, which is an application for the reissue of Pat. No. 8,301,975, which is a continuation of application No. 11/665,171, filed as application No. PCT/CA2005/001563 on Oct. 12, 2005, now Pat. No. 7,996,746.

(60) Provisional application No. 60/673,323, filed on Apr. 20, 2005, provisional application No. 60/656,587, filed on Feb. 25, 2005, provisional application No. 60/647,259, filed on Jan. 26, 2005, provisional application No. 60/639,420, filed on Dec. 27, 2004, provisional application No. 60/638,832, filed on Dec. 22, 2004, provisional application No. 60/635,525, filed on Dec. 13, 2004, provisional application No. 60/627,348, filed on Nov. 12, 2004, provisional application No. 60/617,902, filed on Oct. 12, 2004.

(52) U.S. Cl.
CPC .... *H03M 13/1111* (2013.01); *H03M 13/1137* (2013.01); *H03M 13/1185* (2013.01); *H03M 13/1188* (2013.01); *H03M 13/618* (2013.01); *H03M 13/6362* (2013.01); *H03M 13/6368* (2013.01); *H03M 13/6393* (2013.01); *H04L 1/0057* (2013.01); *H04L 1/0068* (2013.01)

(58) Field of Classification Search
CPC ..... H03M 13/1137; H03M 13/6362; H03M 13/1185; H03M 13/1111; H03M 13/6368; H03M 13/618; H04L 1/0057; H04L 1/0068
See application file for complete search history.

(56) References Cited

U.S. PATENT DOCUMENTS

| | | | | |
|---|---|---|---|---|
| 7,263,651 | B2 | 8/2007 | Xia et al. | H03M 13/1114 714/774 |
| 7,313,752 | B2 | 12/2007 | Kyung et al. | |
| 7,581,157 | B2 | 8/2009 | Oh et al. | |
| 7,607,063 | B2 | 10/2009 | Kikuchi et al. | |
| 7,747,934 | B2 | 6/2010 | Livshitz | |
| 7,752,521 | B2 | 7/2010 | Livshitz | |
| 7,917,829 | B2 | 3/2011 | Livshitz | |
| 7,996,746 | B2 | 8/2011 | Livshitz et al. | |
| 8,024,641 | B2 | 9/2011 | Livshitz et al. | |
| 8,099,646 | B2 | 1/2012 | Livshitz | |
| 8,301,975 | B2 | 10/2012 | Livshitz et al. | |
| RE46,692 | E * | 1/2018 | Livshitz | H03M 13/116 |
| RE48,212 | E * | 9/2020 | Livshitz | H04L 1/0057 |
| 2001/0048744 | A1 | 12/2001 | Kimura | |
| 2002/0009199 | A1 | 1/2002 | Ala-Laurila et al. | |
| 2002/0037014 | A1 | 3/2002 | Myojo et al. | |
| 2002/0045428 | A1 | 4/2002 | Chesson | |
| 2004/0034828 | A1 | 2/2004 | Hocevar et al. | |
| 2005/0050435 | A1 | 3/2005 | Kyung et al. | |
| 2005/0283707 | A1 | 12/2005 | Sharon et al. | H03M 13/635 714/758 |
| 2005/0289437 | A1 | 12/2005 | Oh et al. | |
| 2006/0015791 | A1 | 1/2006 | Kikuchi et al. | |
| 2006/0218459 | A1 * | 9/2006 | Hedberg | H03M 13/353 714/752 |
| 2008/0022191 | A1 | 1/2008 | Stolpman et al. | |
| 2011/0307755 | A1 | 12/2011 | Livshitz et al. | |

OTHER PUBLICATIONS

Classon et al., "LDPC Coding for OFDMA PHY," IEEE C802.16e-04/372, IEEE 802.16 Broadband Wireless Access Working Group, Aug. 24, 2004, 11 pages.
Classon, et al., "LDPC Coding for OFDMA PHY," IEEE C802.16e-04/526rl, IEEE 802.16 Broadband Wireless Access Working Group, Nov. 2004, 7 pages.
Coffey et al., "Joint Proposal: High throughput extension to the 802.11 Standard: PHY," IEEE 802.11-05/1102r4, Jan. 13, 2006, 82 pages.
Coffey, et al. "MAC FEC Performance," Texas Instruments, IEEE 802.11-02/239r0, Mar. 2002, 18 slides, 18 pages.
Du et al., "LDPC for MIMO Systems," IEEE 802.11-04/714r0. Mitsubishi Electric Research Lab, Jul. 2004, 12 slides, 6 pages.
Echard et al., "The π-Rotation Low-Density Parity Check Codes," Global Telecommunications Conference, Nov. 2001, pp. 980-984, 5 pages.
Edmonston, et al., "Turbo Codes for IEEE 802.11n," iCODING Technology Inc., IEEE 802.11-04-0003-00-000n, Jan. 2004, 20 slides, 10 pages.
Jacobsen, "LDPC FEC for IEEE 802.11n Applications," Intel Labs Communications Technology Laboratory, IEEE 802.11-03/865r0, Nov. 10, 2003, 35 slides, 18 pages.
Jacobsen, "LDPC FEC for IEEE 802.11n Applications," IEEE 802.11-03/865rl, Intel Labs, Nov. 10, 2003, 35 slides, 18 pages.
Gorokhov et al., "MIMO-OFDM for high throughput WLAN: experimental results," IEEE 802.11-02/708r0, Philips Research, Nov. 2002, 23 slides, 12 pages.
Gorokhov, et al., "MIMO-OFDM for high throughput WLAN experimental results," Philips Research, IEEE 802.11-02/708rl, IEEE 802.11 session Hawaii Nov. 2002, 23 slides, 12 pages.
Ha, et al., "Puncturing for Finite Length Low-Density Parity Check Codes," ISIT, Proceedings, IEEE Jun. 2004, p. 152, 1 page.
Ha, et al., "Rate Compatible Puncturing of Low-Density Parity-Check Codes," IEEE Transactions on Information Theory, vol. 50, No. 11, Nov. 2004, pp. 2824-2836, 13 pages.
Hillman, "Minutes of High Throughput Task Group Meetings," IEEE 802.11-03/0997-00 Jan. 2004, 17 pages.
Hocevar, "LDPC Code Construction with Flexible Hardware Implementation," IEEE International Conference on Communications, May 2003, vol. 4, pp. 2708-2712, 5 pages.
IEEE Standards Interpretations for IEEE Std 802.11-1999, Institute of Electrical and Electronics Engineers, Inc., Nov. 2008, 5 pages.
IEEE Std 802.11a-1999, "Part 11: Wireless LAN Medium Access Control (MAC) and Physical Layer (PHY) Specifications, High-Speed Physical Layer in the 5 GHz Band," IEEE Computer Society, Sep. 1999, 90 pages.
Kou et al., "Low Density Parity Check Codes Based on Finite Geometries: A Rediscovery and New Results," IEEE Transactions on Information Theory, vol. 47, No. 7, Nov. 2001, pp. 2711-2736, 26 pages.
Liang, et al., "Simplifying MAC FEC Implementation and Related Issues," Texas Instruments Incorporated, IEEE 802.11-02/207r0, Mar. 2002, 15 slides, 8 pages.
Lindskog et al., "Record and Playback PHY Abstraction for 802.11n MAC Simulations—Using Soft PER Estimates," IEEE 802.11-04/182 00rl, Feb. 16, 2004, 12 slides, 6 pages.

(56) References Cited

OTHER PUBLICATIONS

Mansour, et al., "High-Throughput LDPC Decoders," IEEE Transactions on VLSI Systems, vol. 11, No. 6, Dec. 2003, pp. 976-996, 21 pages.
Mahadevappa et al.. "Different Channel Coding Options for MIMO-OFDM 802.11n," IEEE 802.11-04/014r0, Realtek Semiconductors, Jan. 10, 2004, 22 slides, 11 pages.
Mahadevappa et al., "Different Channel Coding Options for MIMO-OFDM 802.11n," IEEE 802.11-04/014rl, Realtek Semiconductors, Jan. 13, 2004, 22 slides, 11 pages.
Moschini et al.. "ST Microelectronics Partial Proposal for LDPCC as optional coding technique for IEEE 802.11 TGn High Throughput Standard," IEEE 802.11-04/898rl, STMicroelectronics, Aug. 13, 2004, 44 pages.
Moschini, et al., "ST Microelectronics LDPCC Proposal for 802.11n CFP," IEEE 802.11-04/900r0, Aug. 2004, 20 slides, 10 pages.
Moschini et al., "Project: IEEE P802.11 Working Group for Wireless Local Area Networks (WLANs)," IEEE 802.11-04/900r4, STMicroelectronics, Aug. 2004, 31 slides, 16 pages.
Niu et al.. "LDPC versus Convolutional Codes in MIMO-OFDM over 11n channels." IEEE 802.11-04/682r0, Samsung Electronics, Jul. 2004, 15 slides, 8 pages.
Ouyang, et al., "On the Use of Reed Solomon Codes for 802.11n," Philips Research, IEEE 802.11-04/96r0, Jan. 2004, 9 slides, 5 pages.
Purkovic et al., "LDPC vs. Convolutional Codes for 802.11n Applications: Performance Comparison," IEEE 802.11-04/071rl, Nortel Networks, Jan. 2004, 12 slides, 6 pages.
Purkovic, et al,, "Algebraic Low-Density Parity-Check Codes for OFDMA PHY Layer," IEEE C802.16e-04/104, May 2004, Nortel Networks, 9 pages.
Purkovic et al., "LDPC vs. Convolutional Codes: Performance and Complexity Comparison," IEEE 802.11-04/337r0, Nortel Networks, Mar. 2004, 10 slides, 5 pages.
Purkovic et al., "Structured LDPC Codes as an Advanced Coding Scheme for 802.11n," IEEE 802.11-04/884r0, Nortel Networks, Aug. 13, 2004, 10 pages.
Purkovic et al., "Structured LDPC Codes as an Advanced Coding Scheme for 802.11n," IEEE 802.11-04/885r0, Nortel Networks, Sep. 2004, 10 slides, 5 pages.
Richardson, et al., "Design of Capacity-Approaching Irregular Low-Density Parity-Check Codes," IEEE Transactions on Information Theory, Feb. 2001, vol. 47, No. 2, pp. 619-637, 19 pages.
Sampath et al., "Record and Playback PHY Abstraction for 802.11n MAC Simulations." IEEE 802.11-04/183 00r3, Mar. 15, 2004, 24 slides, 24 pages.
Schumacher, et al., "Description of a MATLAB® Implementation of the Indoor MIMO WLAN Channel Model Proposed by the IEEE 802.11 TGn Channel Model Special Committee," FUNDP—The University of Namur, Jan. 2004, 27 pages.
Schumacher, et al., "TGn Channel Models," Zyrav Wireless. IEEE 802.11-03/940r4, May 2004, 45 pages.
Shasha et al., "Multi-Rate LDPC code for OFDMA PHY," IEEE C802.16e-04/185, IEEE 802.16 Broadband Wireless Access Working Group, Jun. 26, 2004, 8 pages.
Simoens, et al., "Towards IEEE802.11 HDR in the Enterprise," IEEE 802.11-02/312r0, Motorola, May 2002, 10 slides, 5 pages.
Singh, et al., "WWiSE Proposal: High Throughput Extension to the 802.11 Standard," IEEE P802.11-04-0886-00-000n, Aug. 2004, Section 20.3.5.7.3, 78 pages.
Stephens, et al., "IEEE 802.11 TGn Comparison Criteria," Intel Corp., IEEE 802.11-02/814r5, Dec. 2003, 11 pages.
Stephens, "IEEE 802.11 TGn Comparison Criteria (Phy-related 4.6 sections working document)," IEEE 802.11-02/814r7, Intel Corporation, Jan. 12, 2003, 31 pages.
Stolpman et al., "Irregular structured LDPC codes with rate compatibility for TGn," IEEE 802.11-04/948r0, Nokia, Aug. 13, 2004, 22 pages.
Stolpman, et al., "Irregular structured LDPC codes with rate compatibility for TGn," IEEE 802.11-00/948rl, Sep. 2004, 18 pages.
Stolpman et al., "Structured LDPC code design," IEEE 802.11-04/1362r0, Nokia, Nov. 4, 2004, 11 pages.
Mujtaba, "TGn Sync Proposal Technical Specification," Nov. 2004, IEEE 802.11-04/889rl, Section 11.2.4.4, 143 pages.
Tian et al.. "Construction of Rate-Compatible LDPC Codes Utilizing Information Shortening and Parity Puncturing," EURASIP Journal on Wireless Communications and Networking 2005:5, 789-795, Jul. 2005, 7 pages.
Tian, et al., "Rate-Compatible Low-Density Parity-Check Codes," IEEE, International Symposium on Information Theory, Jun. 2004, p. 153, 1 page.
Tzannes, et al., "Extended Data Rate 802.11a," Aware, Inc., IEEE 802.11-01/232r0, Mar. 2002, 9 slides, 5 pages.
Yazdani, et al., "On Construction of Rate-Compatible Low-Density Parity-Check Codes," IEEE Communication Letters, vol. 8, No. 3, Mar. 2004, pp. 159-161, 3 pages.
Zhang et al.,"VLSI Implementation-Oriented (3, k)-Regular Low-Density Parity-Check Codes," 2001 IEEE Workshop on Signal Processing Systems, Sep. 2001, 12 pages.
Zhong, et al., "Design of VLSI Implementation-Oriented LDPC Codes." IEEE Semiannual Vehicular Technology Conference, Oct. 2003, 4 pages.
PCT International Search Report and Written Opinion in International Application No. PCT/CA2005/001,563, dated Jan. 26, 2006, 10 pages.
PCT International Preliminary Report on Patentability in International Application No. PCT/CA2005/001,563, dated Feb. 13, 2007, 7 pages.
Zhang et al.,"VLSI Implementation-Oriented (3, k)-Regular Low-Density Parity-Check Codes", IEEE, pp. 25-36, Sep. 2001.
Niu, et al., "LDPC versus Convolutional Codes in MIMO-OFDM over 11n channels", IEEE 802.11-04/682r0, Jul. 2004, pp. 1-15.
Du, et al., "LDPC for MIMO Systems", IEEE 802.11-04/0714r0, Jul. 2004, pp. 1-12.
Purkovic, et al., "Structured LDPC Codes as an Advanced Coding Scheme for 802.11n", IEEE 802.11-04/885r0, Sep. 2004, pp. 1-10.
Moschini, et al., "ST Microelectronics Partial Proposal for LDPCC as Optional Coding Technique for IEEE 802.11 TGN High Throughput Standard", IEEE 802.11-04/898R1, Aug. 2004, pp. 1-44.
Moschini, et al., "ST Microelectronics LDPCC Proposal for 802.11N CFP", IEEE 802.11-04/0900R0, Aug. 2004, pp. 1-20.
Stolpman, et al., "Irregular Structured LDPC Codes With Rate Compatibility for TGN", IEEE 802.11-00/XXX, Jan. 2000, pp. 1-18.
Stolpman, et al., "Structured LDPC Code Design", IEEE 802.11-04/1362R0, Nov. 2004, pp. 1-11.
Lindskog, et al., "Record and Playback PHY Abstraction for 802.11N MAC Simulations—Using Soft Per Estimates", IEEE 802.11-04/0182 00R1, Feb. 16, 2004, pp. 1-12.
Sampath, et al., "Record and Playback PHY Abstraction for 802.11N MAC Simulations", IEEE 802.11-04/0183 00R3, Mar. 15, 2004, pp. 1-24.
Stephens, et al., "IEEE 802.11 TGn Comparison Criteria (Phy-related 4.6 sections working document)", Intel Corp., IEEE 802.11-02/814r5, Dec. 2003, pp. 1-22.
Coffey, et al., "Joint Proposal High Throughput Extension to the 802.11 Standard: PHY", IEEE 802.11-05/1102 R4, Jan. 2006, pp. 1-80.
Edmonston, et al., "Turbo Codes for IEEE 802.11n", Icoding Technology, Inc., IEEE 802.11-04-0003-00-000n, Jan. 2004, pp. 1-20
Simoens, et al., "Towards IEEE802.11 HDR in the Enterprise", Motorola, IEEE 802.11-02/312r0, May 2002, pp. 1-10.
Gorokhov, et al., "MIMO-OFDM for high throughput WLAN experimental results", Phillips Research, IEEE 802.11-02-708 R1, IEEE 802.11 session Hawaii Nov. 2002, pp. 1-23.
Mahadevappa, et al., "Different Channel Coding Options for MIMO-OFDM 802.11n", Realtek Semiconductors, Irvine, CA, IEEE 802.11-04/0014r0, Jan. 2004, pp. 1-22.
Jacobsen, et al., "LDPC FEC for IEEE 802.11n Applications", Intel Labs Communications Technology Laboratory, IEEE 802.11-03/0865r0, Nov. 10, 2003, pp. 1-35.

(56) References Cited

OTHER PUBLICATIONS

Purkovic, et al., "LDPC vs. Convolutional Codes for 802.11n Applications: Performance Comparison", Nortel Networks, IEEE 802.11-04/0071r1, Jan. 2004, pp. 1-12.
Tzannes, et al., "Extended Data Rate 802.11a", Aware, Inc., IEEE 802.11-01/232r0, Mar. 2002, pp. 1-9.
Ouyang, et al., "On the Use of Reed Solomon Codes for 802.11n", Philips Research, IEEE 802.11-04/96r0, Jan. 2004, pp. 1-9.
Liang, et al., "Simplifying MAC FEC Implementation and Related Issues", Texas Instruments Incorporated, IEEE 802.11-02/0207r0, Mar. 2002, pp. 1-15.
Coffey, et al., "MAC FEC Performance", Texas Instruments, IEEE 802.11-02/239r0, Mar. 2002, pp. 1-18.
IEEE Standards Interpretations for IEEE Std 802.11a™-1999, Copyright © 2008 by the Institute of Electrical and Electronics Engineers, Inc., Three Park Avenue, New York, New York 10016-5997 USA; pp. 1-6.
Schumacher, et al., "TGn Channel Models", Zyray Wireless, IEEE 802.11-03/940r4, May 2004, pp. 1-46.
Purkovic, et al., "LDPC vs. Convolutional Codes: Performance and Complexity Comparison", Nortel Networks, IEEE 802.11-04/XXXXR0, Mar. 2004, pp. 1-10.
Schumacher, et al., "Description of a MATLAB® implementation of the Indoor MIMO WLAN channel model proposed by the IEEE 802.11 TGn Channel Model Special Committee", FUNDP—The University of Namur, Jan. 2004, pp. 1-27.
R. Echard, et al., "The P-Rotation Low-Density Parity Check Codes", in Proc. Globecom 2001, Nov. 2001, pp. 980-984.
M.M. Mansour, et al., High-Throughput LDPC Decoders, IEEE Trans. on VLSI Systems, vol. 11, No. 6, Dec. 2003, pp. 976-996.
Classon, et al., "LDPC Coding for OFDMA PHY", Nov. 2004, pp. 1-7.
Syed Aon Mujtaba, "TGn Sync Proposal Technical Specification", Nov. 2004, pp. 143, Section 11.2.4.4.
Singh, et al., "WWiSE Proposal: High throughput extension to the 802.11 Standard", Aug. 2004, pp. 45-48, Section 20.3.5.7.3.
Yazdani, et al., "On Construction of Rate Compatible Low-Density Parity-Check Codes", IEEE Communication Letters, vol. 8, No. 3, Mar. 2004 (Abstract enclosed).
Ha, et al., "Puncturing for Finite Length Low-Density Parity Check Codes", ISIT 2004 (Abstract enclosed).
Tian, et al., "Rate Compatible Low-Density Parity-Check Codes", ISIT 2004, Chicago, pp. 153.
Ha, et al., "Rate Compatible Puncturing of Length Low-Density Parity-Check Codes", IEEE Transactions on Information Theory, vol. 50, No. 11, Nov. 2004 (Abstract enclosed).
Zhong, et al., "Design of VLSI Implementation-Oriented LDPC Codes", IEEE Semiannual Vehicular Technology Conference (VTC) Oct. 2003, pp. 1-4.
Richardson, et al., "Design of Capacity-Approaching Irregular Low-Density Parity-Check Codes", IEEE Transactions on Information Theory, Feb. 2001, vol. 47, No. 2, pp. 619-637.
Chung, et al., "Analysis of Sum-Product Decoding of Low-Density Parity-Check Codes Using a Gaussian Approximation", IEEE Transactions on information Theory, vol. 47, Feb. 2001, pp. 657-670.
Purkovic, et al,, "Algebraic Low-Density Parity-Check Codes for OFDMA PHY Layer", Nortel Networks, May 2004, pp. 1-8.
Hocevar, "LDPC Code Construction With Flexible Hardware Implementation", IEEE International Conference on Communications, 2003, vol. 4, pp. 2708-2712.
Hillman, "Minutes of High Throughput Task Group Meetings", Jan. 2004, pp. 1-19.
Classon et al., "LDPC coding for OFDMA PHY", Aug. 24, 2004, IEEE 802, 16 Broadband Wireless Access Working Group, pp. 0-10.
Kou et al., "Low Density Parity Check Codes Based on Finite Geometries: A Rediscovery and New Results", Nov. 2001, IEEE transactions on Information theory, vol. 47, No. 7, pp. 2711-2736.
Tian et al., "Construction of rate compatible LDPC codes utilizing information shortening and parity puncturing", 2005, EURASIP Journal on Wireless Communications and Networking, pp. 789-795.
Shasha, Eli et al., "Multi-Rate LDPC code for OFDMA PHY", IEEE 802, 16 Broadband Wireless Access Working Group, Jun. 26, 2004, (Abstract enclosed), pp. 1-7.
Purkovic et al., "LDPC vs. Convolutional Codes for 802.11n Applications: Performance Comparison," IEEE 802.11-04/0071r1, Nortel Networks, Jan. 2004, 12 pages [source name: 11-04-0071-01-000n-11-04-0071-01-000n-ldpc-vs-convolutional-codes-for-802-11n-applications-performance-comparison.ppt].
Purkovic et al., "LDPC vs. Convolutional Codes: Performance and Complexity Comparison," IEEE 802.11-04/xxxxr0, Nortel Networks, Mar. 2004, 10 pages [source name: 11-04-0337-00-000n-ldpc-vs-convolutional-codes-performance-and-complexity- -comparison.ppt].
Niu et al., 'LDPC versus Convolutional Codes in MIMO-OFDM over 11n channels, IEEE 802.11-04/682r0, Samsung Electronics, Jul. 2004, 15 pages [source name: 11-04-0682-00-000n-ldpc-vs-cc-over-11n-channels.ppt].
Du et al., "LDPC for MIMO Systems," IEEE 802.11-04/0714r0, Mitsubishi Electric Research Lab, Jul. 2004, 12 pages [source name: 11-04-0714-00-000n-ldpc-coding-mimo-systems.ppt].
Purkovic et al., "Structured LDPC Codes as an Advanced Coding Scheme for 802.11n," IEEE 802.11-04/884r0, Nortel Networks, Aug. 13, 2004, 10 pages [source name: 11-04-0884-00-000n-structured-ldpc-codes-as-advanced-coding-scheme-802-11n.doc].
Purkovic et al., "Structured LDPC Codes as an Advanced Coding Scheme for 802.11n," IEEE 802.11-04/885r0, Nortel Networks, Sep. 2004, 10 pages [source name: 11-04-0885-00-000n-structured-ldpc-codes-as-advanced-coding-scheme-802-11- n-presentation-slides.ppt].
Moschini et al., "ST Microelectronics Partial Proposal for LDPCC as optional coding technique for IEEE 802.11 TGn High Troughput Standard," IEEE 802.11-04/898rl, STMicroelectronics, Aug. 13, 2004, 44 pages [source name: 11-04-0898-02-000n-stmicroldpccpartialproposalspecification.doc].
Moschini et al., "Project: IEEE P802.11 Working Group for Wireless Local Area Networks (WLANS)," IEEE 802.11-04/0900r4, STMicroelectronics, Aug. 2004, 31 pages [source name: 11-04-0900-04-000n-stmicro-ldpcc-partial-proposal-presentation.ppt].
Stolpman et al., "Irregular structured LDPC codes with rate compatibility for TGn," IEEE 802.11-00/xxx, Nokia, Aug. 13, 2004, 18 pages [source name: 11-04-0948-02-000n-irregular-structured-ldpc-codes-with-rate-compat- ibility-tgn.doc].
Stolpman et al., "Structured LDPC code design," IEEE 802.11-04/1362r0, Nokia, Nov. 4, 2004, 11 pages [source name: 11-04-1362-00-000n-structured-ldpc-code-design.doc].
Lindskog et al., "Record and Playback PHY Abstraction for 802.11n MAC Simulations—Using Soft PER Estimates," IEEE 802.11-04/0182 00r1, Feb. 16, 2004, 12 pages [source name:11-04-0182-01-000n-record-and-playback-phy-abstraction-802-11n-mac-s- imulations-using-soft-per-estimates.ppt].
Sampath et al., "Record and Playback PHY Abstraction for 802.11n Mac Simulations," IEEE 802.11-04/018300r3, Mar. 15, 2004, 24 pages [source name: 11-04-0183-03-000n-record-and-playback-phy-abstraction-802-11n-mac -simulations-using-binary-per-estimates.ppt].
Adrian P. Stephens, "IEEE 802.11 TGn Comparison Criteria (Phy-related 4.6 sections working document)," IEEE 802.11-02/814r7, Intel Corporation, Jan. 12, 2003, 29 pages [source name: 11-04-0053-05-000n-phy-related-comparison-criteria-section-4-6.doc].
Coffey et al., "Joint Proposal: High throughput extension to the 802.11 Standard: PHY," IEEE 802.11-05/1102r4, Jan. 13, 2006, 83 pages [source name: 11-05-1102-04-000n-joint-proposal-phy-specification.doc].
Eric Jacobsen, "LDPC FEC for IEEE 802.11n Applications," IEEE 802.11-03/0865r1, Intel Labs, Nov. 10, 2003, 35 pages [source name: 11-03-0865-01-000n-ldpc-fec-802-11n-applications.ppt].
IEEE Std 802.11a-1999, "Part 11: Wireless LAN Medium Access Control (MAC) and Physical Layer (PHY) Specifications, High-Speed Physical Layer in the 5 GHz Band," IEEE Computer Society, 1999, 91 pages.

(56) References Cited

OTHER PUBLICATIONS

Mahadevappa et al., "Different Channel Coding Options for MIMO-OFDM 802.11n," IEEE 802.11-04/0014r1, Realtek Semiconductors, Jan. 2004, 22 pages [source name: 11-04-0014-01-000n-diff-channel-codes-mimo-ofdm.ppt].
Eric Jacobsen, "LDPC FEC for IEEE 802.11n Applications," IEEE 802.11-03/865r1, Intel Labs, Nov. 2003, 35 pages. [source name: 11-03-0865-01-000n-ldpc-fec-802-11n-applications.ppt].
Gorokhov et al., "MIMO-OFDM for high throughput WLAN: experimental results," IEEE 802.11-02/708r0, Philips Research, Nov. 2002, 23 pages. [source name: 11-02-0708-00-0wng-mimo-for-high-throughput-wlan-experimental-results.ppt].
United States Patent and Trademark Office, Notice of Allowance, in connection with U.S. Appl. No. 11/665,171 on Apr. 1, 2011 (5 pages).
United States Patent and Trademark Office, Office Action, in connection with U.S. Appl. No. 11/665,171 on Dec. 21, 2010 (10 pages).
United States Patent and Trademark Office, Notice of Allowance, in connection with U.S. Appl. No. 11/665,171 on Sep. 7, 2010 (8 pages).
United States Patent and Trademark Office, Office Action, in connection with U.S. Appl. No. 11/665,171 on Jan. 29, 2010 (6 pages).
United States Patent and Trademark Office, Notice of Allowance, in connection with U.S. Appl. No. 12/704,850 on Apr. 29, 2011 (5 pages).
United States Patent and Trademark Office, Office Action, in connection with U.S. Appl. No. 12/704,850 on Jan. 19, 2011 (10 pages).
United States Patent and Trademark Office, Office Action, in connection with U.S. Appl. No. 12/704,850 on Aug. 30, 2010 (5 pages).
United States Patent and Trademark Office, Notice of Allowance, in connection with U.S. Appl. No. 11/454,824 on Feb. 17, 2010 (7 pages).
United States Patent and Trademark Office, Supplemental Notice of Allowability, in connection with U.S. Appl. No. 11/454,824 on Nov. 12, 2009 (2 pages).
United States Patent and Trademark Office, Notice of Allowance, in connection with U.S. Appl. No. 11/454,824 on Nov. 2, 2009 (4 pages).
United States Patent and Trademark Office, Office Action, in connection with U.S. Appl. No. 11/454,824 on Jun. 5, 2009 (8 pages).
United States Patent and Trademark Office, Notice of Allowance, in connection with U.S. Appl. No. 12/987,729 on Sep. 13, 2011 (8 pages).
United States Patent and Trademark Office, Office Action, in connection with U.S. Appl. No. 12/987,729 on Mar. 15, 2011 (10 pages).
United States Patent and Trademark Office, Notice of Allowance, in connection with U.S. Appl. No. 12/796,453 on Oct. 8, 2010 (8 pages).
United States Patent and Trademark Office, Office Action, in connection with U.S. Appl. No. 12/796,453 on Aug. 30, 2010 (5 pages).
United States Patent and Trademark Office, Notice of Allowance, in connection with U.S. Appl. No. 11/393,622 on Mar. 3, 2010 (7 pages).
United States Patent and Trademark Office, Notice of Allowance, in connection with U.S. Appl. No. 11/393,622 on Nov. 25, 2009 (4 pages).
United States Patent and Trademark Office, Office Action, in connection with U.S. Appl. No. 11/393,622 on Apr. 13, 2009 (9 pages).
United States Patent and Trademark Office, Notice of Allowance, in connection with U.S. Appl. No. 13/346,155 on Feb. 16, 2012 (5 pages).
United States Patent and Trademark Office, Notice of Allowance, in connection with U.S. Appl. No. 13/346,155 on Jun. 5, 2012 (5 pages).
Patent Cooperation Treaty, "International Search Report," issued by the International Searching Authority in connection with PCT application No. PCT/CA2005/001563, mailed Jan. 26, 2006 (4 pages).
Patent Cooperation Treaty, "Written Opinion of the International Searching Authority," issued by the International Searching Authority in connection with PCT/CA2005/001563, mailed Jan. 26, 2006 (6 pages).
Patent Cooperation Treaty, "International Preliminary Report on Patentability," issued by the International Preliminary Examining Authority in connection with PCT application No. PCT/CA2005/001563, issued on Feb. 13, 2007 (7 pages).

* cited by examiner

2

| | | | | | | | | | | | | | | | | | | | | | | | |
|---|---|---|---|---|---|---|---|---|---|---|---|---|---|---|---|---|---|---|---|---|---|---|---|
| 1 | 0 | 0 | 0 | 0 | 1 | 0 | 0 | 0 | 0 | 0 | 1 | 1 | 0 | 0 | 0 | 1 | 0 | 0 | 0 | 0 | 0 | 0 | 0 |
| 0 | 0 | 1 | 0 | 0 | 0 | 1 | 0 | 1 | 0 | 0 | 0 | 0 | 1 | 0 | 0 | 0 | 0 | 0 | 1 | 0 | 0 | 0 | 0 |
| 0 | 1 | 0 | 0 | 0 | 0 | 0 | 1 | 0 | 0 | 1 | 0 | 0 | 0 | 1 | 0 | 0 | 0 | 1 | 0 | 0 | 0 | 0 | 0 |
| 0 | 0 | 0 | 1 | 1 | 0 | 0 | 0 | 0 | 1 | 0 | 0 | 0 | 0 | 0 | 1 | 0 | 1 | 0 | 0 | 0 | 0 | 0 | 0 |
| 0 | 0 | 1 | 0 | 0 | 0 | 0 | 0 | 0 | 1 | 0 | 0 | 0 | 0 | 1 | 0 | 1 | 0 | 0 | 0 | 1 | 0 | 0 | 0 |
| 0 | 0 | 0 | 1 | 0 | 0 | 0 | 0 | 0 | 0 | 1 | 0 | 0 | 1 | 0 | 0 | 0 | 1 | 0 | 0 | 0 | 1 | 0 | 0 |
| 1 | 0 | 0 | 0 | 0 | 0 | 0 | 0 | 0 | 0 | 0 | 1 | 1 | 0 | 0 | 0 | 0 | 0 | 1 | 0 | 0 | 0 | 1 | 0 |
| 0 | 1 | 0 | 0 | 0 | 0 | 0 | 0 | 1 | 0 | 0 | 0 | 0 | 0 | 0 | 1 | 0 | 0 | 0 | 1 | 0 | 0 | 0 | 1 |
| 0 | 0 | 0 | 0 | 0 | 0 | 0 | 1 | 0 | 0 | 1 | 0 | 1 | 0 | 0 | 0 | 0 | 0 | 0 | 0 | 1 | 0 | 0 | 0 |
| 0 | 0 | 0 | 0 | 1 | 0 | 0 | 0 | 0 | 0 | 0 | 1 | 0 | 1 | 0 | 0 | 0 | 0 | 0 | 0 | 0 | 0 | 1 | 0 |
| 0 | 0 | 0 | 0 | 0 | 1 | 0 | 0 | 1 | 0 | 0 | 0 | 0 | 0 | 1 | 0 | 0 | 0 | 0 | 0 | 0 | 1 | 0 | 0 |
| 0 | 0 | 0 | 0 | 0 | 0 | 1 | 0 | 0 | 1 | 0 | 0 | 0 | 0 | 0 | 1 | 0 | 0 | 0 | 0 | 0 | 0 | 0 | 1 |

21

22

23

41

| | | | | | | | |
|---|---|---|---|---|---|---|---|
| 1 | 0 | 1 | 0 | 1 | 0 | 0 | 0 |
| 1 | 0 | 0 | 1 | 1 | 1 | 0 | 0 |
| 0 | 1 | 1 | 0 | 0 | 1 | 1 | 0 |
| 1 | 0 | 0 | 1 | 0 | 0 | 1 | 1 |

Base matrix

43

42

| | | | | | | | | | | | | | | | | | | | | | | | |
|---|---|---|---|---|---|---|---|---|---|---|---|---|---|---|---|---|---|---|---|---|---|---|---|
| 1 | 0 | 0 | 0 | 0 | 0 | 0 | 1 | 0 | 0 | 0 | 0 | 1 | 0 | 0 | 0 | 0 | 0 | 0 | 0 | 0 | 0 | 0 | 0 |
| 0 | 1 | 0 | 0 | 0 | 0 | 0 | 0 | 1 | 0 | 0 | 0 | 0 | 1 | 0 | 0 | 0 | 0 | 0 | 0 | 0 | 0 | 0 | 0 |
| 0 | 0 | 1 | 0 | 0 | 0 | 1 | 0 | 0 | 0 | 0 | 0 | 0 | 0 | 1 | 0 | 0 | 0 | 0 | 0 | 0 | 0 | 0 | 0 |
| 0 | 1 | 0 | 0 | 0 | 0 | 0 | 0 | 0 | 1 | 0 | 0 | 1 | 0 | 0 | 1 | 0 | 0 | 0 | 0 | 0 | 0 | 0 | 0 |
| 0 | 0 | 1 | 0 | 0 | 0 | 0 | 0 | 0 | 0 | 1 | 0 | 0 | 1 | 0 | 0 | 1 | 0 | 0 | 0 | 0 | 0 | 0 | 0 |
| 1 | 0 | 0 | 0 | 0 | 0 | 0 | 0 | 0 | 0 | 0 | 1 | 0 | 0 | 1 | 0 | 0 | 1 | 0 | 0 | 0 | 0 | 0 | 0 |
| 0 | 0 | 0 | 1 | 0 | 0 | 0 | 1 | 0 | 0 | 0 | 0 | 0 | 0 | 0 | 1 | 0 | 0 | 1 | 0 | 0 | 0 | 0 | 0 |
| 0 | 0 | 0 | 0 | 1 | 0 | 0 | 0 | 1 | 0 | 0 | 0 | 0 | 0 | 0 | 0 | 1 | 0 | 0 | 1 | 0 | 0 | 0 | 0 |
| 0 | 0 | 0 | 0 | 0 | 1 | 1 | 0 | 0 | 0 | 0 | 0 | 0 | 0 | 0 | 0 | 0 | 1 | 0 | 0 | 1 | 0 | 0 | 0 |
| 0 | 0 | 1 | 0 | 0 | 0 | 0 | 0 | 0 | 0 | 0 | 1 | 0 | 0 | 0 | 0 | 0 | 0 | 1 | 0 | 0 | 1 | 0 | 0 |
| 1 | 0 | 0 | 0 | 0 | 0 | 0 | 0 | 0 | 1 | 0 | 0 | 0 | 0 | 0 | 0 | 0 | 0 | 0 | 1 | 0 | 0 | 1 | 0 |
| 0 | 1 | 0 | 0 | 0 | 0 | 0 | 0 | 0 | 0 | 1 | 0 | 0 | 0 | 0 | 0 | 0 | 0 | 0 | 0 | 1 | 0 | 0 | 1 |

Expanded matrix

| | | | | | | | |
|---|---|---|---|---|---|---|---|
| 1 | 0 | 1 | 0 | 1 | 1 | 0 | 0 |
| 1 | 0 | 0 | 1 | 1 | 1 | 1 | 0 |
| 0 | 1 | 1 | 0 | 0 | 0 | 1 | 1 |
| 1 | 0 | 0 | 1 | 1 | 0 | 0 | 1 |

51

Base matrix

52

| | | | | | | | | | | | | | | | | | | | | | | |
|---|---|---|---|---|---|---|---|---|---|---|---|---|---|---|---|---|---|---|---|---|---|---|
| 1 | 0 | 0 | 0 | 0 | 0 | 0 | 1 | 0 | 0 | 0 | 0 | 1 | 0 | 0 | 1 | 0 | 0 | 0 | 0 | 0 | 0 | 0 | 0 |
| 0 | 1 | 0 | 0 | 0 | 0 | 0 | 0 | 1 | 0 | 0 | 0 | 0 | 1 | 0 | 0 | 1 | 0 | 0 | 0 | 0 | 0 | 0 | 0 |
| 0 | 0 | 1 | 0 | 0 | 0 | 1 | 0 | 0 | 0 | 0 | 0 | 0 | 0 | 1 | 0 | 0 | 1 | 0 | 0 | 0 | 0 | 0 | 0 |
| 0 | 1 | 0 | 0 | 0 | 0 | 0 | 0 | 0 | 1 | 0 | 0 | 1 | 0 | 0 | 1 | 0 | 0 | 1 | 0 | 0 | 0 | 0 | 0 |
| 0 | 0 | 1 | 0 | 0 | 0 | 0 | 0 | 0 | 0 | 1 | 0 | 0 | 1 | 0 | 0 | 1 | 0 | 0 | 1 | 0 | 0 | 0 | 0 |
| 1 | 0 | 0 | 0 | 0 | 0 | 0 | 0 | 0 | 0 | 0 | 1 | 0 | 0 | 1 | 0 | 0 | 1 | 0 | 0 | 1 | 0 | 0 | 0 |
| 0 | 0 | 0 | 1 | 0 | 0 | 0 | 1 | 0 | 0 | 0 | 0 | 0 | 0 | 0 | 0 | 0 | 0 | 1 | 0 | 0 | 1 | 0 | 0 |
| 0 | 0 | 0 | 0 | 1 | 0 | 0 | 0 | 1 | 0 | 0 | 0 | 0 | 0 | 0 | 0 | 0 | 0 | 0 | 1 | 0 | 0 | 1 | 0 |
| 0 | 0 | 0 | 0 | 0 | 1 | 1 | 0 | 0 | 0 | 0 | 0 | 0 | 0 | 0 | 0 | 0 | 0 | 0 | 0 | 1 | 0 | 0 | 1 |
| 0 | 0 | 1 | 0 | 0 | 0 | 0 | 0 | 0 | 0 | 0 | 1 | 1 | 0 | 0 | 0 | 0 | 0 | 0 | 0 | 0 | 1 | 0 | 0 |
| 1 | 0 | 0 | 0 | 0 | 0 | 0 | 0 | 0 | 1 | 0 | 0 | 0 | 1 | 0 | 0 | 0 | 0 | 0 | 0 | 0 | 0 | 1 | 0 |
| 0 | 1 | 0 | 0 | 0 | 0 | 0 | 0 | 0 | 0 | 1 | 0 | 0 | 0 | 1 | 0 | 0 | 0 | 0 | 0 | 0 | 0 | 0 | 1 |

Expanded matrix

250

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|
| 1 | | | 33 | | 19 | 36 | | 1 | 4 | | | | 1 | 0 | | | | | | | | | | |
| 2 | 52 | | | | 48 | 18 | | | 19 | | 0 | | | 0 | 0 | | | | | | | | | |
| 3 | 37 | | | | 15 | 65 | 11 | | 8 | | | 49 | | | 0 | 0 | | | | | | | | |
| 4 | | | 15 | | 67 | 20 | | | 44 | 61 | | | | | | 0 | 0 | | | | | | | |
| 5 | | | | 45 | 12 | 41 | | | 2 | 42 | | | | | | | 0 | 0 | | | | | | |
| 6 | | | | 33 | 45 | 12 | | 63 | 71 | | 49 | | | | | | | 0 | 0 | | | | | |
| 7 | | | 0 | | 5 | 38 | | | 45 | | | 23 | 0 | | | | | | 0 | 0 | | | | |
| 8 | | 17 | | | 63 | 45 | | 38 | 26 | | | | | | | | | | | 0 | 0 | | | |
| 9 | | 25 | | | 68 | 52 | 54 | | 47 | 55 | | | | | | | | | | | 0 | 0 | | |
| 10 | 2 | | | | 55 | 59 | 47 | | 4 | | | | | | | | | | | | | 0 | 0 | |
| 11 | | | | 15 | 16 | 4 | | | 26 | | | 3 | | | | | | | | | | | 0 | 0 |
| 12 | | 47 | | | 3 | 40 | | | 58 | | 9 | | 1 | | | | | | | | | | | 0 |

$H_d$ $H_p$ puncturing shortening

FIG. 25

Matrix #1: Code rate R=1/2

| | | | | | | | | | | | | | | | | | | | | | | |
|---|---|---|---|---|---|---|---|---|---|---|---|---|---|---|---|---|---|---|---|---|---|---|
| 19 | -1 | -1 | 33 | 36 | -1 | -1 | 1 | 4 | -1 | -1 | -1 | 1 | 0 | -1 | -1 | -1 | -1 | -1 | -1 | -1 | -1 | -1 |
| 48 | 52 | -1 | -1 | 18 | -1 | -1 | -1 | 19 | -1 | 0 | -1 | -1 | 0 | 0 | -1 | -1 | -1 | -1 | -1 | -1 | -1 | -1 |
| 15 | 37 | -1 | -1 | 65 | -1 | 49 | -1 | 8 | -1 | -1 | 11 | -1 | -1 | 0 | 0 | -1 | -1 | -1 | -1 | -1 | -1 | -1 |
| 67 | -1 | -1 | 15 | 20 | -1 | -1 | -1 | 44 | 61 | -1 | -1 | -1 | -1 | -1 | 0 | 0 | -1 | -1 | -1 | -1 | -1 | -1 |
| 12 | -1 | -1 | -1 | 41 | 45 | -1 | -1 | 2 | 42 | -1 | -1 | -1 | -1 | -1 | -1 | 0 | 0 | -1 | -1 | -1 | -1 | -1 |
| 45 | -1 | -1 | -1 | 12 | 33 | -1 | 63 | 71 | -1 | 49 | -1 | -1 | -1 | -1 | -1 | -1 | 0 | 0 | -1 | -1 | -1 | -1 |
| 5 | -1 | -1 | 0 | 38 | -1 | 23 | -1 | 45 | -1 | -1 | -1 | 0 | -1 | -1 | -1 | -1 | -1 | 0 | 0 | -1 | -1 | -1 |
| 63 | -1 | 17 | -1 | 45 | -1 | -1 | 38 | 26 | -1 | -1 | -1 | -1 | -1 | -1 | -1 | -1 | -1 | -1 | 0 | 0 | -1 | -1 |
| 68 | -1 | 25 | -1 | 52 | -1 | -1 | -1 | 47 | 55 | -1 | 54 | -1 | -1 | -1 | -1 | -1 | -1 | -1 | -1 | 0 | 0 | -1 |
| 55 | 2 | -1 | -1 | 59 | -1 | -1 | -1 | 4 | -1 | -1 | 47 | -1 | -1 | -1 | -1 | -1 | -1 | -1 | -1 | -1 | 0 | 0 |
| 16 | -1 | -1 | -1 | 4 | 15 | 3 | -1 | 26 | -1 | -1 | -1 | -1 | -1 | -1 | -1 | -1 | -1 | -1 | -1 | -1 | 0 | 0 |
| 3 | -1 | 47 | -1 | 40 | -1 | -1 | -1 | 58 | -1 | 9 | -1 | 1 | -1 | -1 | -1 | -1 | -1 | -1 | -1 | -1 | -1 | 0 |

Matrix #2: Code rate R=2/3

| | | | | | | | | | | | | | | | | | | | | | | |
|---|---|---|---|---|---|---|---|---|---|---|---|---|---|---|---|---|---|---|---|---|---|---|
| 29 | -1 | 6 | -1 | 30 | 70 | -1 | 40 | 70 | -1 | -1 | -1 | 9 | 25 | -1 | -1 | 1 | 0 | -1 | -1 | -1 | -1 | -1 |
| 52 | -1 | 19 | -1 | 25 | -1 | 10 | -1 | 20 | -1 | 22 | 56 | 0 | -1 | 11 | -1 | -1 | 0 | 0 | -1 | -1 | -1 | -1 |
| 21 | 34 | -1 | 44 | 31 | -1 | 1 | -1 | 52 | -1 | -1 | -1 | 44 | -1 | 36 | -1 | -1 | -1 | 0 | 0 | -1 | -1 | -1 |
| 39 | -1 | -1 | 1 | 6 | 41 | -1 | -1 | 71 | 42 | -1 | 18 | 32 | -1 | -1 | -1 | -1 | -1 | -1 | 0 | 0 | -1 | -1 |
| 11 | -1 | -1 | 55 | 19 | -1 | -1 | 19 | 7 | -1 | 15 | -1 | 51 | 8 | -1 | 45 | 0 | -1 | -1 | -1 | 0 | 0 | -1 |
| 68 | 0 | -1 | -1 | 58 | -1 | 40 | -1 | 71 | 58 | -1 | -1 | 4 | 49 | 48 | -1 | -1 | -1 | -1 | -1 | -1 | 0 | 0 |
| 37 | 10 | -1 | -1 | 19 | 25 | -1 | -1 | 0 | -1 | 29 | -1 | 63 | -1 | -1 | 51 | -1 | -1 | -1 | -1 | -1 | -1 | 0 |
| 66 | -1 | 65 | -1 | 51 | -1 | -1 | 15 | 23 | 60 | -1 | 28 | 7 | -1 | -1 | 36 | 1 | -1 | -1 | -1 | -1 | -1 | -1 |

Matrix #3: Code rate R=3/4

| | | | | | | | | | | | | | | | | | | | | | | |
|---|---|---|---|---|---|---|---|---|---|---|---|---|---|---|---|---|---|---|---|---|---|---|
| 0 | 23 | -1 | -1 | 0 | 47 | 53 | 1 | -1 | 5 | -1 | 13 | 66 | 34 | -1 | 62 | 65 | -1 | 1 | 0 | -1 | -1 | -1 |
| 14 | 57 | 7 | 11 | -1 | -1 | 69 | -1 | 25 | 34 | -1 | 25 | 13 | -1 | 19 | 70 | -1 | 35 | -1 | 0 | 0 | -1 | -1 |
| 59 | 3 | -1 | 18 | -1 | 43 | 48 | 58 | -1 | 29 | -1 | 54 | 49 | -1 | 25 | 0 | 66 | -1 | -1 | -1 | 0 | 0 | -1 |
| 15 | 1 | 2 | -1 | -1 | 39 | 19 | -1 | 37 | 64 | 52 | -1 | 28 | 4 | -1 | 21 | 20 | -1 | 0 | -1 | -1 | 0 | 0 |
| 22 | 64 | -1 | 48 | 60 | -1 | 36 | -1 | 15 | 62 | 68 | -1 | 46 | 55 | -1 | 41 | -1 | 7 | -1 | -1 | -1 | -1 | 0 |
| 63 | 36 | 57 | -1 | 55 | -1 | 41 | 34 | -1 | 45 | 46 | -1 | 8 | -1 | 37 | 44 | -1 | 15 | 1 | -1 | -1 | -1 | 0 |

Matrix #4: Code rate R=5/6

| | | | | | | | | | | | | | | | | | | | | | | |
|---|---|---|---|---|---|---|---|---|---|---|---|---|---|---|---|---|---|---|---|---|---|---|
| 52 | 20 | 41 | -1 | 45 | 43 | 56 | 43 | 27 | 63 | 50 | -1 | 37 | 51 | 2 | -1 | 23 | 31 | 66 | 34 | 1 | 0 | -1 |
| 31 | -1 | 52 | 55 | 43 | 33 | 47 | -1 | 20 | 12 | 35 | 45 | 44 | -1 | 21 | 3 | 24 | 20 | 58 | 36 | -1 | 0 | 0 |
| 54 | 14 | 0 | 37 | 64 | 58 | 33 | 48 | 57 | -1 | 16 | 8 | 61 | 36 | 54 | 25 | 19 | -1 | 2 | 26 | 0 | -1 | 0 |
| 3 | 27 | 58 | 12 | 56 | -1 | 17 | 44 | 21 | 52 | 62 | 59 | 19 | 23 | 45 | 42 | 52 | 28 | 21 | -1 | 1 | -1 | 0 |

Matrix #5 - Code rate R=7/8

| | | | | | | | | | | | | | | | | | | | | | | |
|---|---|---|---|---|---|---|---|---|---|---|---|---|---|---|---|---|---|---|---|---|---|---|
| 11 | 4 | 62 | 67 | 51 | 25 | 3 | 58 | 62 | 47 | 3 | 14 | 57 | 60 | 14 | 47 | 55 | 60 | 18 | 46 | 45 | 1 | 0 | -1 |
| 51 | 69 | 25 | 1 | 53 | 52 | 65 | 59 | 59 | 17 | 36 | 46 | 13 | 7 | 43 | 54 | 70 | 34 | 38 | 10 | 10 | 0 | 0 | 0 |
| 56 | 62 | 3 | 34 | 17 | 71 | 47 | 2 | 21 | 7 | 44 | 2 | 35 | 71 | 37 | 50 | 35 | 61 | 13 | 31 | 21 | 1 | -1 | 0 |

FIG 26a

Matrix #6 - Code rate R=3/4

| | | | | | | | | | | | | | | | | | | | | | | |
|---|---|---|---|---|---|---|---|---|---|---|---|---|---|---|---|---|---|---|---|---|---|---|
| 86 | 14 | 39 | 11 | 91 | 73 | -1 | -1 | -1 | -1 | 3 | 60 | 80 | 89 | -1 | 85 | 7 | -1 | 48 | 0 | -1 | -1 | -1 | -1 |
| 62 | 94 | 54 | 3 | 32 | 41 | 0 | 2 | 81 | 1 | -1 | 88 | -1 | -1 | -1 | -1 | 56 | -1 | -1 | 0 | 0 | -1 | -1 | -1 |
| 10 | 25 | 93 | 14 | 86 | 18 | -1 | -1 | 75 | 8 | 85 | -1 | 51 | 17 | -1 | -1 | -1 | 30 | -1 | -1 | 0 | 0 | -1 | -1 |
| 45 | 8 | 87 | 92 | 39 | 79 | 85 | 50 | 0 | -1 | -1 | -1 | -1 | -1 | 18 | -1 | 76 | 4 | 0 | -1 | -1 | 0 | 0 | -1 |
| 31 | 78 | 48 | 41 | 6 | 89 | 11 | -1 | -1 | 95 | -1 | 24 | -1 | -1 | 57 | 64 | -1 | 61 | -1 | -1 | -1 | -1 | 0 | 0 |
| 20 | 83 | 72 | 61 | 43 | 14 | -1 | 74 | -1 | -1 | 87 | -1 | 4 | 2 | 87 | 3 | -1 | -1 | 48 | -1 | -1 | -1 | -1 | 0 |

Matrix #7 - Code rate R=3/4

| | | | | | | | | | | | | | | | | | | | | | | |
|---|---|---|---|---|---|---|---|---|---|---|---|---|---|---|---|---|---|---|---|---|---|---|
| 74 | 31 | 70 | 36 | -1 | -1 | -1 | 16 | 87 | -1 | 27 | -1 | 42 | 29 | 54 | 10 | -1 | 44 | 48 | 0 | -1 | -1 | -1 | -1 |
| 52 | 37 | 92 | 64 | -1 | 82 | 17 | -1 | 77 | -1 | -1 | 12 | -1 | 81 | 32 | 13 | 92 | -1 | -1 | 0 | 0 | -1 | -1 | -1 |
| 21 | -1 | 87 | -1 | 25 | 0 | 78 | 63 | -1 | 17 | -1 | -1 | 77 | -1 | 15 | 89 | 14 | 18 | -1 | -1 | 0 | 0 | -1 | -1 |
| 92 | 75 | -1 | 13 | 8 | 90 | 78 | 59 | -1 | 69 | 2 | 15 | -1 | -1 | -1 | -1 | 51 | 40 | 0 | -1 | -1 | 0 | 0 | -1 |
| -1 | -1 | -1 | -1 | 38 | 5 | 39 | 85 | 26 | 7 | 93 | 39 | 39 | 64 | 89 | 37 | -1 | -1 | -1 | -1 | -1 | -1 | 0 | 0 |
| -1 | 72 | 2 | 23 | 20 | -1 | -1 | -1 | 73 | 53 | 69 | 59 | 85 | 41 | -1 | -1 | 29 | 24 | 48 | -1 | -1 | -1 | -1 | 0 |

Matrix #8 - Code rate R=3/4

| | | | | | | | | | | | | | | | | | | | | | | |
|---|---|---|---|---|---|---|---|---|---|---|---|---|---|---|---|---|---|---|---|---|---|---|
| 9 | 33 | 41 | 90 | -1 | -1 | -1 | 90 | 62 | -1 | 23 | -1 | 81 | 60 | 25 | 95 | -1 | 33 | 48 | 0 | -1 | -1 | -1 | -1 |
| 48 | 60 | 78 | 89 | -1 | 47 | 50 | -1 | 30 | -1 | -1 | 13 | -1 | 37 | 4 | 8 | 71 | -1 | -1 | 0 | 0 | -1 | -1 | -1 |
| 86 | -1 | 46 | -1 | 26 | 95 | 69 | 18 | -1 | 65 | -1 | -1 | 4 | -1 | 52 | 91 | 26 | 44 | -1 | -1 | 0 | 0 | -1 | -1 |
| 27 | 38 | -1 | 70 | 22 | 1 | 42 | 36 | -1 | 9 | 91 | 69 | -1 | -1 | -1 | -1 | 19 | 81 | 0 | -1 | -1 | 0 | 0 | -1 |
| -1 | -1 | -1 | -1 | 39 | 26 | 73 | 32 | 57 | 20 | 10 | 19 | 94 | 54 | 57 | 6 | -1 | -1 | -1 | -1 | -1 | -1 | 0 | 0 |
| -1 | 29 | 3 | 52 | 92 | -1 | -1 | -1 | 35 | 22 | 2 | 23 | 7 | 26 | -1 | -1 | 55 | 6 | 48 | -1 | -1 | -1 | -1 | 0 |

Matrix #9 - Code rate R=3/4

| | | | | | | | | | | | | | | | | | | | | | | |
|---|---|---|---|---|---|---|---|---|---|---|---|---|---|---|---|---|---|---|---|---|---|---|
| 6 | 38 | 3 | 93 | -1 | -1 | -1 | 30 | 70 | -1 | 86 | -1 | 37 | 38 | 4 | 11 | -1 | 46 | 48 | 0 | -1 | -1 | -1 | -1 |
| 62 | 94 | 19 | 84 | -1 | 92 | 78 | -1 | 15 | -1 | -1 | 92 | -1 | 45 | 24 | 32 | 30 | -1 | -1 | 0 | 0 | -1 | -1 | -1 |
| 71 | -1 | 55 | -1 | 12 | 66 | 45 | 79 | -1 | 78 | -1 | -1 | 10 | -1 | 22 | 55 | 70 | 82 | -1 | -1 | 0 | 0 | -1 | -1 |
| 38 | 61 | -1 | 66 | 9 | 73 | 47 | 64 | -1 | 39 | 61 | 43 | -1 | -1 | -1 | -1 | 95 | 32 | 0 | -1 | -1 | 0 | 0 | -1 |
| -1 | -1 | -1 | -1 | 32 | 52 | 55 | 80 | 95 | 22 | 6 | 51 | 24 | 90 | 44 | 20 | -1 | -1 | -1 | -1 | -1 | -1 | 0 | 0 |
| -1 | 63 | 31 | 88 | 20 | -1 | -1 | -1 | 6 | 40 | 56 | 16 | 71 | 53 | -1 | -1 | 27 | 26 | 48 | -1 | -1 | -1 | -1 | 0 |

Matrix #10 - Code rate R=5/6

| | | | | | | | | | | | | | | | | | | | | | | |
|---|---|---|---|---|---|---|---|---|---|---|---|---|---|---|---|---|---|---|---|---|---|---|
| 55 | 66 | 40 | 23 | 34 | 60 | 70 | 8 | 70 | 6 | 69 | 46 | 39 | 32 | 62 | 30 | 16 | 15 | 51 | 47 | 1 | 0 | -1 | -1 |
| 49 | 46 | 1 | 42 | 30 | 16 | 21 | 65 | 22 | 11 | 66 | 24 | 66 | 53 | 69 | 18 | 28 | 22 | 62 | 66 | -1 | 0 | 0 | -1 |
| 17 | 21 | 19 | 14 | 38 | 45 | 12 | 19 | 64 | 20 | 61 | 13 | 66 | 11 | 65 | 47 | 40 | 6 | 36 | 24 | 0 | -1 | 0 | 0 |
| 70 | 25 | 68 | 55 | 55 | 45 | 7 | 61 | 8 | 55 | 45 | 42 | 51 | 14 | 33 | 34 | 18 | 64 | 66 | 50 | 1 | -1 | -1 | 0 |

FIG 26b

Matrix #11: Code rate R=5/6

| | | | | | | | | | | | | | | | | | | | | | | |
|---|---|---|---|---|---|---|---|---|---|---|---|---|---|---|---|---|---|---|---|---|---|---|
| 21 | 27 | 71 | 11 | 1 | 40 | 95 | 2 | 24 | 65 | 90 | 61 | 92 | 37 | 89 | 55 | 2 | 11 | 6 | 89 | 48 | 0 | -1 | -1 |
| 2 | 73 | 5 | 21 | 65 | 32 | 12 | 38 | 93 | 22 | 86 | 77 | 16 | 90 | 40 | 1 | 80 | 93 | 31 | 55 | -1 | 0 | 0 | -1 |
| 41 | 54 | 19 | 84 | 11 | 8 | 79 | 90 | 62 | 70 | 5 | 3 | 25 | 79 | 68 | 86 | 85 | 6 | 63 | 77 | 0 | -1 | 0 | 0 |
| 8 | 1 | 84 | 93 | 24 | 87 | 1 | 70 | 33 | 1 | 1 | 91 | 61 | 41 | 7 | 2 | 77 | 66 | 92 | 82 | 48 | -1 | -1 | 0 |

Matrix #12: Code rate R=5/6

| | | | | | | | | | | | | | | | | | | | | | | |
|---|---|---|---|---|---|---|---|---|---|---|---|---|---|---|---|---|---|---|---|---|---|---|
| 89 | 16 | 28 | 66 | 67 | 58 | 16 | 90 | 75 | 88 | 6 | 9 | 5 | 91 | 53 | 17 | 6 | 13 | 86 | 1 | 48 | 0 | -1 | -1 |
| 57 | 80 | 6 | 95 | 0 | 79 | 12 | 80 | 23 | 3 | 75 | 47 | 64 | 1 | 13 | 69 | 52 | 95 | 69 | 77 | -1 | 0 | 0 | -1 |
| 74 | 58 | 61 | 2 | 92 | 71 | 93 | 9 | 84 | 36 | 27 | 91 | 93 | 72 | 9 | 7 | 61 | 7 | 26 | 63 | 0 | -1 | 0 | 0 |
| 16 | 68 | 94 | 77 | 8 | 3 | 31 | 23 | 67 | 74 | 48 | 95 | 1 | 59 | 91 | 95 | 88 | 72 | 0 | 31 | 48 | -1 | -1 | 0 |

FIG 26c

STRUCTURED LOW-DENSITY PARITY-CHECK (LDPC) CODE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application *is a continuation reissue application, which is a reissue application of U.S. application Ser. No. 13/156,942, filed on Jun. 9, 2011 and issued as U.S. Pat. No. 8,301,975 on Oct. 30, 2012 and a continuation of U.S. application Ser. No. 15/838,188, filed on Dec. 11, 2017, which is a reissue application of U.S. application Ser. No. 13/156,942, filed on Jun. 9, 2011 and issued as U.S. Pat. No. 8,301,975 on Oct. 30, 2012 and a divisional of Ser. No. 14/527,483, filed Oct. 29, 2014 and issued as U.S. Pat. No. RE46,692 on Jan. 30, 2018, which is a reissue application of U.S. application Ser. No. 13/156,942, filed on Jun. 9, 2011 and issued as U.S. Pat. No. 8,301,975 on Oct. 30, 2012, which is a continuation of U.S. application Ser. No. 11/665,171, filed on Jul. 29, 2008 and issued as U.S. Pat. No. 7,996,746 on Aug. 9, 2011, which is a National Stage Entry of PCT/CA2005/01563 filed on Oct. 12, 2005, which* claims the benefits of U.S. Provisional Applications No. 60/635,525, filed Dec. 13, 2004; 60/617,902, filed Oct. 12, 2004; 60/627,348, filed Nov. 12, 2004; [60/635,525, filed Dec. 13, 2004;] 60/638,832, filed Dec. 22, 2004; 60/639,420, filed Dec. [22] *27*, 2004; 60/647,259, filed Jan. 26, 2005; 60/656,587, filed Feb. 25, 2005; and 60/673,323, filed Apr. 20, 2005.

FIELD OF THE INVENTION

The present invention generally pertains to forward error correction. In particular, the present invention relates to structured Low-Density Parity-Check (LDPC) codes.

BACKGROUND OF THE INVENTION

In a typical communication system, forward error correction (FEC) is often applied in order to improve robustness of the system against a wide range of impairments of the communication channel.

Referring to FIG. 1, in which a typical communication network channel is depicted having an information source 101, sending data to a source coder 102 that in turn forwards the data to a channel encoder 103. The encoded data is then modulated 104 onto a carrier before being transmitted over a channel 105. After transmission, a like series of operations takes place at the receiver using a demodulator 106, channel decoder 107 and source decoder 108 to produce data suitable for the information sink 109. FEC is applied by encoding the information data stream at the transmit side at the encoder 103, and performing the inverse decoding operation on the receive side at the decoder 107. Encoding usually involves generation of redundant (parity) bits that allow more reliable reconstruction of the information bits at the receiver.

In many modern communication systems, FEC uses Low-Density Parity-Check (LDPC) codes that are applied to a block of information data of the finite length.

One way to represent LDPC codes is by using so-called Tanner graphs, in which N symbol nodes, correspond to bits of the codeword, and M check nodes, correspond to the set of parity-check constraints which define the code. Edges in the graph connect symbol nodes to check nodes.

LDPC codes can also be specified by a parity check matrix H of size M×N. In the matrix H, each column corresponds to one of the symbol nodes while each row corresponds to one of the check nodes. This matrix defines an LDPC block code (N, K), where K is the information block size, N is the length of the codeword, and M is the number of parity check bits. M=N−K. A general characteristic of the LDPC parity check matrix is the low density of non-zero elements that allows utilization of efficient decoding algorithms. The structure of the LDPC code parity check matrix is first outlined in the context of existing hardware architectures that can exploit the properties of these parity check matrices.

In order to accommodate various larger code rates without redesigning parity check matrix and therefore avoiding changing significantly base hardware wiring, expansion of a base parity check matrix is one of the common approach. This may be archived, for example, by replacing each non-zero element by a permutation matrix of the size of the expansion factor.

One problem often faced by the designer of LDPC codes is that the base parity check matrices are designed to follow some assumed degree distribution, which is defined as the distribution of column weights of the parity check matrix. Column weight in turn equals the number of in a column. It has been shown that irregular degree distributions offer the best performance on the additive white Gaussian noise channel. However, the base parity check matrix does not exhibit any structure in its $H_d$ portion to indicate the final matrix after expansion. The number of sub-matrix blocks, corresponding to the number of sub-iterations in the layered decoding algorithm may become large. Since the maximum number of rows that can be processed in parallel equals the number of rows in the sub-matrix block, the overall throughput may be impacted.

Another problem is that in order to maintain the performance such as coding gain as high as possible, there are different requirements such as to select the largest suitable codeword from the available set of codewords and then properly adjust the amount of shortening and puncturing; use as few of the modulated symbols as possible; and keep the overall complexity at a reasonable level.

Some attempts have been made to enhance the throughput by reducing the number of rows of the base parity matrix, and consequently the number of block of rows in the expanded parity check matrix, by combining rows as a method to increase the code rate without changing the degree distribution. However, the derived high rate matrix is still relatively large, since in order to allow row combining, the original low rate base parity matrix usually has a large number of rows. The decoding time also becomes a function of the code rate: the higher the code rate the less layers in the layered decoding and, in general, less decoding time.

Other existing approaches for shortening and puncturing of the expanded matrices may preserve the column weight distribution, but may severely disturb the row weight distribution of the original matrix. This, in turn, causes degradation when common iterative decoding algorithms are used. This adverse effect strongly depends on the structure of the expanded matrix.

Therefore, there is an unmet need for a method, a system to design structured base parity check matrices, in combination with expansion, allow achieving high throughput, low latency, and at the same time, the preservation of the simple encoding feature of the expanded codeword.

There is further an unmet need for a method and a system to enable flexible rate adjustments by using shortening, or puncturing, or a combination of shortening and puncturing; and at the same time the code rate is approximately the same as the original one, and the coding gain is preserved.

SUMMARY OF THE INVENTION

In accordance with a first aspect of the present invention there is provided a method for constructing a low-density parity-check (LDPC) code having a structured parity check matrix comprising the steps of: a) constructing a structured base parity check matrix having a plurality of sub-matrices, the sub-matrices are selected from a group consisting of permutation matrix, pseudo-permutation matrix, and zero matrix; and b) expanding the structured base parity check matrix into an expanded parity check matrix.

Preferably, the sub-matrices in the plurality of sub-matrices have the same size.

Preferably, a majority of the plurality of sub-matrices has the same size, and a small subset of the sub-matrices is constructed by concatenating smaller permutation sub-matrices, pseudo-permutation matrices or zero matrices.

Preferably, the method of claim 1 wherein the base parity check matrix is in the form of $H=[H_d|H_p]$, $H_d$ being a data portion of the parity check matrix, $H_p$ being a parity portion of the parity check matrix.

Preferably, the expanding step further comprises the steps of: replacing each non-zero member of the sub-matrices by a permutation matrix or a pseudo-permutation matrix; and replacing each zero member of the sub-matrices by a zero matrix.

Preferably, the parity portion of the structured base parity check matrix comprises a dual diagonal.

In accordance with another aspect of the present invention there is provided a method for decoding data stream encoded using the LDPC code comprising the steps of: a) receiving a set of input values corresponding to variable nodes of the structured parity check matrix; and b) estimating a probability value of the variable nodes based on the plurality of parity checks contained within an block of parity checks corresponding to a row of sub-matrices of the base parity check matrix, over the blocks of the base parity check matrix.

Preferably, the estimating step is repeated until a termination criterion is reached.

In accordance with another aspect of the present invention there is provided a device for decoding data stream encoded using LDPC code, comprising: a) intra-layer storage elements for receiving a set of input values corresponding to variable nodes of the structured parity check matrix, and for storing the updated variable nodes information; b) a read network for delivering the information from the intra-layer storage elements to the processing units; c) processing units for estimating a probability value of the variable nodes based on a plurality of parity checks contained within a block of parity checks corresponding to a row of sub-matrices of the base parity check matrix; d) inter-layer storage for storing additional information from sub-matrices concatenated using sub-matrices selected from a group consisting of permutation matrix, pseudo-permutation matrix, and zero matrix; and d) a write network for delivering the results from processing units to the intra-layer storage elements.

In accordance with another aspect of the present invention there is provided a method for constructing a low-density parity-check (LDPC) code having a structured parity check matrix comprising the steps of: a) constructing a structured base parity check matrix $H=[H_d|H_p]$, $H_d$ being a data portion of the parity check matrix, $H_p$ being a parity portion of the parity check matrix; b) selecting a parity portion of the structured base parity check matrix so that when expanded, an inverse of the parity portion of the expanded parity check matrix is sparse; and c) expanding the structured base parity check matrix into an expanded parity check matrix.

In accordance with another aspect of the present invention there is provided a method for constructing a low-density parity-check (LDPC) code having a structured parity check matrix, the method comprising the steps of: a) constructing a base parity check matrix $H=[H_d|H_p]$ having a plurality of elements, $H_d$ being a data portion of the parity check matrix, $H_p$ being the parity portion of the parity check matrix; b) expanding the base parity check matrix into an expanded parity check matrix by replacing each non-zero element of the plurality of elements by a shifted identity matrix, and each zero element of the plurality of elements by a zero matrix; wherein the base parity check matrix has a coding rate selected from the group consisting of R=½, ⅔, ¾, ⅚, and ⅞; and accordingly is of the size selected from the group consisting of 12×24, 8×24, 6×24, 4×24, and 3×24.

Preferably, the base parity check matrix has a coding rate of R=¾, and is:

| | | | | | | | | | | | | | | | | | | | | | | | |
|---|---|---|---|---|---|---|---|---|---|---|---|---|---|---|---|---|---|---|---|---|---|---|---|
| 1 | 1 | 1 | 1 | 0 | 0 | 0 | 1 | 1 | 0 | 1 | 0 | 1 | 1 | 1 | 1 | 0 | 1 | 1 | 1 | 0 | 0 | 0 | 0 |
| 1 | 1 | 1 | 1 | 0 | 1 | 1 | 0 | 1 | 0 | 0 | 1 | 0 | 1 | 1 | 1 | 1 | 0 | 0 | 1 | 1 | 0 | 0 | 0 |
| 1 | 0 | 1 | 0 | 1 | 1 | 1 | 1 | 0 | 1 | 0 | 0 | 1 | 0 | 1 | 1 | 1 | 1 | 0 | 0 | 1 | 1 | 0 | 0 |
| 1 | 1 | 0 | 1 | 1 | 1 | 1 | 1 | 0 | 1 | 1 | 1 | 0 | 0 | 0 | 0 | 1 | 1 | 1 | 0 | 0 | 1 | 1 | 0 |
| 0 | 0 | 0 | 0 | 1 | 1 | 1 | 1 | 1 | 1 | 1 | 1 | 1 | 1 | 1 | 1 | 0 | 0 | 0 | 0 | 0 | 0 | 1 | 1 |
| 0 | 1 | 1 | 1 | 1 | 0 | 0 | 0 | 1 | 1 | 1 | 1 | 1 | 1 | 0 | 0 | 1 | 1 | 1 | 0 | 0 | 0 | 0 | 1. |

More preferably, the base parity check matrix is expanded by expansion factors L between 24 and $L_{max}$=96, and is represented by the expanded parity check matrix:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 45 | 48 | 0 | −1 | −1 | −1 | −1 |
| 62 | 94 | 19 | 84 | −1 | 92 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 35 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 56 | 16 | 71 | 53 | −1 | −1 | 27 | 26 | 48 | −1 | −1 | −1 | −1 | 0 |

wherein −1 represents L×L all-zero square matrix, the integer $s_{ij}$ represents circular shifted L×L identity matrix, the amount of the shift $s'_{ij}$ is determined as follows:

$$s'_{ij} = \begin{cases} \text{floor}\left(\frac{L \times s_{ij}}{L_{max}}\right), & s_{ij} > 0 \\ s_{ij}, & \text{otherwise.} \end{cases}$$

In accordance with another aspect of the present invention there is provided a method for encoding variable sized data using low-density parity-check (LDPC) code and transporting the encoded variable sized data in modulated symbols, the method comprising the steps of: a) calculating a minimum number of modulated symbols capable for transmitting a data packet; b) selecting an expanded parity check matrix having a proper codeword size suitable for transmitting the data packet; c) calculating a number of shortening Nshortened bits to be used during transmission of the data packet; and d) calculating a number of puncturing Npunctured bits to, be used during transmission of the data packet.

Preferably, the method further comprises the steps of: a) constructing one or more than one structured base parity check matrix $H=[H_d|H_p]$, $H_d$ being a data portion of the parity check matrix, $H_p$ being a parity portion of the parity check matrix; and b) expanding the one or more than one structured base parity check matrix into one or more than one expanded parity check matrix, each of the one or more than one expanded parity check matrix having a different codeword size for use in the selecting step.

Preferably, the method further comprises the steps of: a) determining a performance criterion of the shortened and punctured expanded parity check matrix; b) adding an additional symbol to transmit the encoded data packet in the case when performance criterion is not met; and c) recalculating the amount of puncturing $N_{punctured}$ bits.

Preferably, the method further comprises the steps of: a) selecting $N_{shortened}$ variable nodes from the expanded parity check matrix; b) ensuring a uniform or a close to uniform row weight distribution after removing columns corresponding to the selected $N_{shortened}$ variable nodes; and c) ensuring a new column weight distribution as close as possible to an original column weight distribution after removing the columns corresponded to the selected $N_{shortened}$ variable nodes from the selected expanded parity check matrix.

Preferably, the selecting $N_{shortened}$ variable nodes step further comprises the step of selecting variable nodes belonging to consecutive columns in the selected expanded parity check matrix.

Preferably, the ensuring a new column weight distribution step further comprises the step of prearranging columns of the data portion Hd of the selected expanded parity check matrix.

Preferably, the method further comprises the steps of: a) determining a performance criterion of the shortened and punctured expanded parity check matrix; b) adding an additional symbol to transmit the encoded data packet in the case when the performance criterion is not met; and c) recalculating the amount of puncturing $N_{punctured}$ bits.

Preferably, the method further comprises the steps of a) selecting $N_{shortened}$ variable nodes from the expanded parity check matrix; b) ensuring a uniform or a close to uniform row weight distribution after removing columns corresponding to the selected $N_{shortened}$ variable nodes; and c) ensuring a new column weight distribution as close as possible to an original column weight distribution after removing the columns corresponded to the selected $N_{shortened}$ variable nodes from the selected expanded parity check matrix.

More preferably, the selecting step further comprises the step of selecting variable nodes belonging to consecutive columns in the selected expanded parity check matrix.

More preferably, the ensuring step further comprises the step of prearranging columns of the data portion $H_d$ of the selected expanded parity check matrix.

Preferably, the method further comprises the steps of a) selecting $N_{punctured}$ variable nodes from the selected expanded parity check matrix; b) ensuring each of the selected $N_{punctured}$ variable nodes is connected to fewest possible check nodes; and c) ensuring that all of the selected $N_{punctured}$ nodes are connected to most possible check nodes.

Preferably, the performance criterion is selected from the group consisting of a threshold for $N_{punctured}$, a threshold for $N_{shortened}$, a threshold for normalized shortening to puncturing ratio, $q_{normalized}$, and a combination thereof; wherein $q_{normalized}$ is defined as:

$$q_{normalized}=(N_{shortened}/N_{punctured})/[R/(1-R)].$$

More preferably, the threshold for a $q_{normalized}$ is set to be in the range of 1.2-1.5.

More preferably, the threshold for $q_{normalized}$ is set to be equal to 1.2.

In accordance with another aspect of the present invention there is provided a method of shortening low-density parity-check (LDPC) code comprising the steps of: a) selecting variable nodes in a parity check matrix; b) ensuring a uniform or a close to uniform row weight distribution after removing the selected variable nodes; and c) ensuring a new column weight distribution as close as possible to an original column weight distribution after removing the columns corresponded to the selected variable nodes.

Preferably, the method further comprises the step of selecting variable nodes that belongs to consecutive columns in the parity check matrix.

Preferably, the method further comprises the step of prearranging columns of the data portion of parity check matrix.

In accordance with another aspect of the present invention there is provided a method of puncturing a low-density parity-check (LDPC) code comprising the steps of: a) selecting variable nodes in a parity check matrix; b) ensuring that each of the selected variable nodes is connected to fewest possible check nodes; and c) ensuring that all of the selected variable nodes are connected to most possible check nodes.

Preferably, the method further comprises the step of selecting variable nodes belonging to consecutive columns in the parity check matrix.

BRIEF DESCRIPTION OF THE DRAWINGS

The invention and the illustrated embodiments may be better understood, and the numerous objects, advantages, and features of the present invention and illustrated embodiments will become apparent to those skilled in the art by reference to the accompanying drawings, and wherein:

FIG. 25 is an example of a parity check matrix suited for both puncturing and shortening operation and used to obtain the results illustrated in FIG. 24; and FIGS. 26a, 26b and 26c are matrices for use in relevant encoding methods and systems.

DETAILED DESCRIPTION OF EMBODIMENTS OF THE INVENTION

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations have not been described in detail in order not to unnecessarily obscure the present invention.

Efficient decoder architectures are enabled by designing the parity check matrix, which in turn defines the LDPC code, around some structural assumptions: structured LDPC codes.

One example of this design is that the parity check matrix comprises sub-matrices in the form of binary permutation or pseudo-permutation matrices.

The term "permutation matrix" is intended to mean square matrices with the property that each row and each column has one element equal to 1 and other elements equal to 0. Identity matrix, a square matrix with ones on the main diagonal and zeros elsewhere, is a specific example of permutation matrix. The term "pseudo-permutation matrix" is intended to include matrices that are not necessarily square matrices, and matrices may have row(s) and/or column(s) consisting of all zeros. It has been shown, that using this design, significant savings in wiring, memory, and power consumption are possible while still preserving the main portion of the coding gain. This design enables various serial, parallel, and semi-parallel hardware architectures and therefore various trade-off mechanisms.

Figures 1, 2:
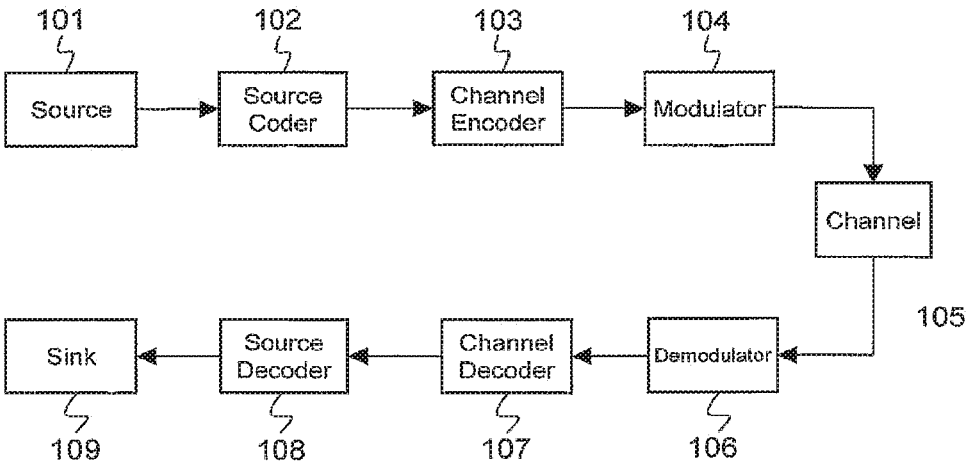
FIG. 1 shows a typical system in which embodiments of the present invention may be practiced.
FIG. 2 is an example of a structured LDPC code parity check matrix.

This structured code also allows the application of layered decoding, also referred to as layered belief propagation decoding, which exhibits improved convergence properties compared to a conventional sum-product algorithm (SPA) and its derivations. Each iteration of the layered decoding consists of a number of sub-iterations that equals the number of blocks of rows (or layers). FIG. 2 shows a matrix having three such layers 21, 22, 23.

LDPC code parity check matrix design also results in the reduction in encoder complexity. Classical encoding of LDPC codes is more complex than encoding of other advanced codes used in FEC, such as turbo codes. In order to ease this complexity it has become common to design systematic LDPC codes with the parity portion of the parity check matrix containing a lower triangular matrix. This allows simple recursive decoding. One simple example of a lower triangular matrix is a dual diagonal matrix as shown in FIG. 3.

Figure 3:
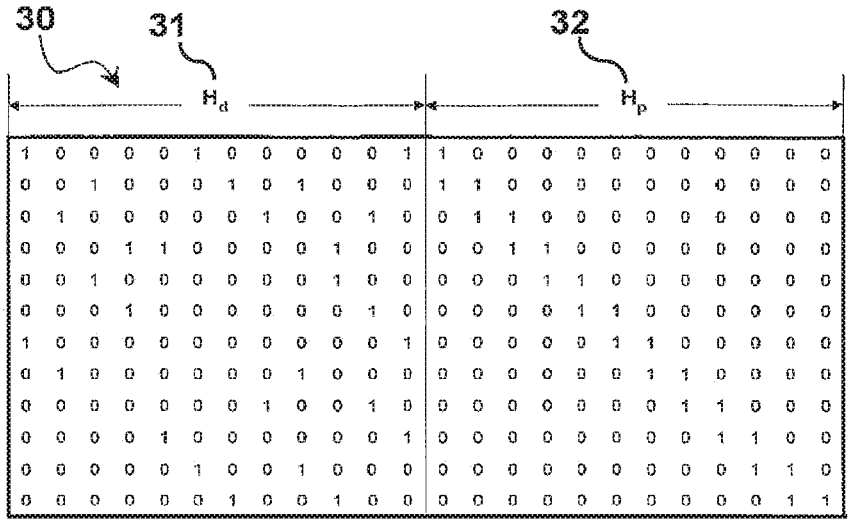
FIG. 3 depicts an example of a parity check matrix with dual diagonal.

Referring to FIG. 3, the parity check matrix 30 is partitioned as $H=[H_d|H_p]$. Data portion $H_d$ 31 is an M×K matrix that corresponds to the data bits of the codeword. The design of the $H_d$ 31 matrix ensures high coding gain. Parity portion $H_p$ 32 is in this example an M×M dual diagonal matrix and corresponds to the parity bits of the codeword. These codes are systematic block codes. The codeword vector for these systematic codes has the structure:

$$c = \left[\frac{d}{p}\right]$$

where $d=[d_0 \ . \ . \ . \ d_{k-1}]^T$ is the block of data bits and $p=[p_0 \ . \ . \ . \ p_{M-1}]^T$ are the parity bits. A codeword is any binary, or in general, non-binary, N-vector c that satisfies:

$$Hc=H_d d+H_p p=0$$

Thus, a given data block d is encoded by solving binary equation $H_d d=H_p p$ for the parity bits p. In principle, this involves inverting the M×M matrix $H_p$ to resolve p:

$$p=H_p^{-1}H_d d \qquad \text{[equation 1]}$$

$H_p$ is assumed to be invertible. If the inverse of $H_p$, $H_p^{-1}$ is also low density then the direct encoding specified by the above formula can be done efficiently. However, with the dual diagonal structure of $H_p$ 32 encoding can be performed as a simple recursive algorithm:

$$p_0 = \sum_{n=1}^{k_0} h_{0,i_n^0} d_{i_n^0},$$

where $i_n^0$ is the index of the column in which row 0 contains a "1"

$$p_1 = p_0 + \sum_{n=1}^{k_1} h_{1,i_n^1} d_{i_n^1},$$

where $i_n^1$ is the index of the column in which row 1 contains a "1"

...

$$p_{M-1} = p_{M-2} + \sum_{n=1}^{k_{M-1}} h_{M-1,i_n^{M-1}} d_{i_n^{M-1}},$$

where $i_n^{M-1}$ is the index of the column in which row M−1 contains a "1".

In these recursive expressions $h_{r,c}$ are non-zero elements (1 in this exemplary matrix) of the data portion of the parity check matrix, $H_d$ 31. The number of non-zero elements in rows 0, 1, . . . , M−1, is represented by $k_0, k_1, \ldots, k_{M-1}$, respectively.

One desirable feature of LDPC codes is that they support various required code rates and block sizes. A common approach is to have a small base parity check matrix defined for each required code rate and to support various block sizes by expanding the base parity check matrix. Since it is usually required to support a range of block sizes, a common approach is to define expansion for the largest block size and then apply other algorithms which specify expansion for smaller block sizes. Below is an example of a base parity check matrix:

| | | | | | | | | | | | |
|---|---|---|---|---|---|---|---|---|---|---|---|
| 11 | 0 | 10 | 6 | 3 | 5 | −1 | 0 | −1 | −1 | −1 | −1 |
| 10 | 9 | 2 | 2 | 3 | 0 | −1 | 0 | 0 | −1 | −1 | −1 |
| 7 | 9 | 11 | 10 | 4 | 7 | −1 | −1 | 0 | 0 | −1 | −1 |
| 9 | 2 | 4 | 6 | 5 | 3 | 0 | −1 | −1 | 0 | 0 | −1 |

-continued

| | | | | | | | | | | | |
|---|---|---|---|---|---|---|---|---|---|---|---|
| 3 | 11 | 2 | 4 | 2 | 11 | −1 | −1 | −1 | −1 | 0 | 0 |
| 2 | 7 | 1 | 0 | 10 | 7 | 1 | −1 | −1 | −1 | −1 | 0 |

In this example the base parity check matrix is designed for the code rate R=½ and its dimensions are $(M_b \times N_b)=(6\times 12)$. Assume that the codeword sizes (lengths) to be supported are in the range N=[72, 144], with increments of 12, i.e. N=[72, 84, . . . , 132, 144]. In order to accommodate those block lengths the parity check matrix needs to be of the appropriate size (i.e. the number of columns match N, the block length). The number of rows is defined by the code rate: M=(1−R) N. The expansion is defined by the base parity check matrix elements and the expansion factor L, which results in the maximum block size. The conventions used in this example, for interpreting the numbers in the base parity check matrix, are as follows:

−1, represents L×L all-zero square matrix, $0_L$, L equals 12 in this example;

0, represents L×L identity matrix, $I_L$.

integer, r (<L), represents L×L identity matrix, $I_L$, rotated to the right (for example) a number of times corresponding to the integer.

The following example shows a rotated identity matrix where the integer specifying rotation is 5:

| | | | | | | | | | | | |
|---|---|---|---|---|---|---|---|---|---|---|---|
| 0 | 0 | 0 | 0 | 0 | 1 | 0 | 0 | 0 | 0 | 0 | 0 |
| 0 | 0 | 0 | 0 | 0 | 0 | 1 | 0 | 0 | 0 | 0 | 0 |
| 0 | 0 | 0 | 0 | 0 | 0 | 0 | 1 | 0 | 0 | 0 | 0 |
| 0 | 0 | 0 | 0 | 0 | 0 | 0 | 0 | 1 | 0 | 0 | 0 |
| 0 | 0 | 0 | 0 | 0 | 0 | 0 | 0 | 0 | 1 | 0 | 0 |
| 0 | 0 | 0 | 0 | 0 | 0 | 0 | 0 | 0 | 0 | 1 | 0 |
| 0 | 0 | 0 | 0 | 0 | 0 | 0 | 0 | 0 | 0 | 0 | 1 |
| 1 | 0 | 0 | 0 | 0 | 0 | 0 | 0 | 0 | 0 | 0 | 0 |
| 0 | 1 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 |
| 0 | 0 | 0 | 1 | 0 | 0 | 0 | 0 | 0 | 0 | 0 | 0 |
| 0 | 0 | 0 | 0 | 1 | 0 | 0 | 0 | 0 | 0 | 0 | 0 |

Therefore, for the largest block (codeword) size of N=144, the base parity check matrix needs to be expanded by an expansion factor of 12. That way the final expanded parity check matrix to be used for encoding and generating the codeword of size 144, is of the size (72×144). In other words, the base parity check matrix was expanded $L_{max}$=12 times (from 6×12 to 72×144). For the block sizes smaller than the maximum, the base parity check matrix is expanded by a factor $L<L_{max}$. In this case expansion is performed in the similar fashion except that now matrices $I_L$ and $0_L$, are used instead of $I_{Lmax}$ and $0_{Lmax}$, respectively. Integers specifying the amount of rotation of the appropriate identity matrix, $I_L$, are derived from those corresponding to the maximum expansion by applying some algorithm. For example, such an algorithm may be a simple modulo operation:

$$r_L=(r_{Lmax})\text{modulo } L$$

Figure 4:
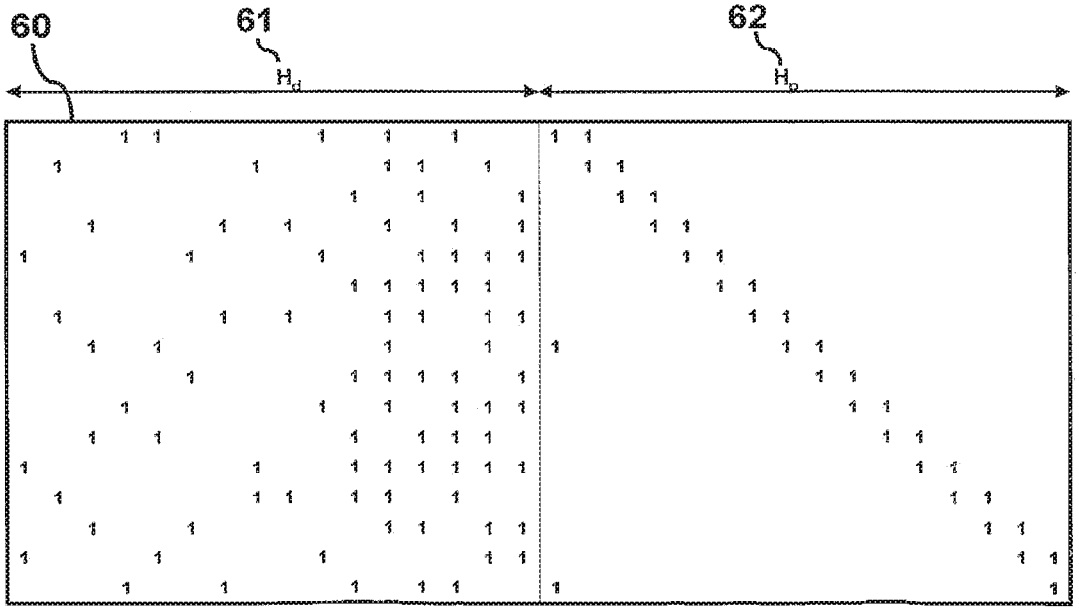
FIG. 4 illustrates an example of unstructured data portion in a base parity check matrix.
Figures 5, 6:
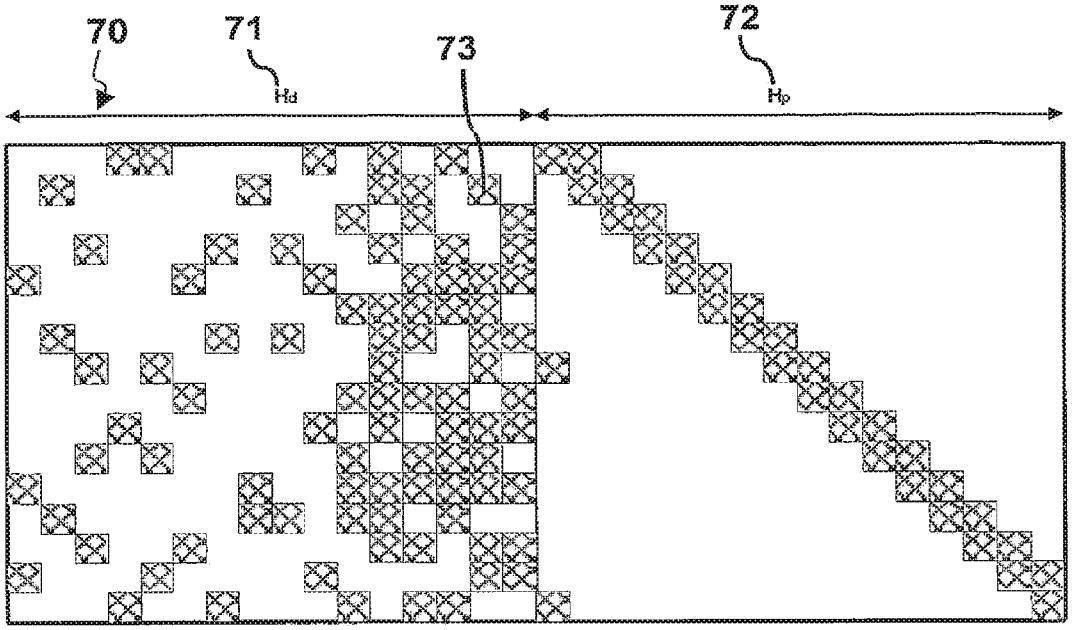
FIG. 5 is an example of the expanded unstructured base parity check matrix of FIG. 4.
FIG. 6 is an example of a parity check matrix expansion.

An example of such a matrix is shown in FIG. 4 where the data portion $H_d$ 61 and the parity portion $H_p$ 62 of a matrix 60. The corresponding expanded parity check matrix is shown in FIG. 5 also having a data portion $H_d$ 71 and the parity portion $H_p$ 72 of the matrix 70. Each of the shaded squares 73 indicates a L×L small permutation matrix that is placed on the position of the 1's in the base parity check matrix, where L is the expansion factor. In other words, if the size of the base parity check matrix was $M_b \times N_b$, the size of expanded parity check matrix is now $M \times N = LM_b \times LN_b$.

The expansion may be done for example by replacing each non-zero element with a permutation matrix of the size of the expansion factor. One example of performing expansion is as follows.

$H_p$ is expanded by replacing each "0" element by an L×L zero matrix, $0_{L \times L}$, and each "1" element by an L×L identity matrix, $I_{L \times L}$, where L represent the expansion factor.

$H_d$ is expanded by replacing each "0" element by an L×L zero matrix, $0_{L \times L}$, and each "1" element by a circularly shifted version of an L×L identity matrix, $I_{L \times L}$. The shift order, s (number of circular shifts, for example, to the right) is determined for each non-zero element of the base parity check matrix.

It should be apparent to a person skilled in the art that these expansions can be implemented without the need to significantly change the base hardware wiring.

FIG. 6 shows an example of a base parity check matrix 41 and a corresponding expanded parity check matrix 42 using 3×3 sub-matrices of which that labeled 43 is an example.

The simple recursive algorithm described earlier can still be applied in a slightly modified form to the expanded parity check matrix. If $h_{i,j}$ represent elements of the $H_d$ portion of the expanded parity check matrix, then parity bits can be determined as follows:

$$p_0=h_{0,0}d_0+h_{0,1}d_1+h_{0,2}d_2+\ldots+h_{0,11}d_{11}$$

$$p_1=h_{1,0}d_0+h_{1,1}d_1+h_{1,2}d_2+\ldots+h_{1,11}d_{11}$$

$$p_2=h_{2,0}d_0+h_{2,1}d_1+h_{2,2}d_2+\ldots+h_{2,11}d_{11}$$

$$p_3=p_0+h_{3,0}d_0+h_{3,1}d_1+h_{3,2}d_2+\ldots+h_{3,11}d_{11}$$

$$p_4=p_1+h_{4,0}d_0+h_{4,1}d_1+h_{4,2}d_2+\ldots+h_{4,11}d_{11}$$

$$p_5=p_2+h_{5,0}d_0+h_{5,1}d_1+h_{5,2}d_2+\ldots+h_{5,11}d_{11}$$

$$p_6=p_3+h_{6,0}d_0+h_{6,1}d_1+h_{6,2}d_2+\ldots+h_{6,11}d_{11}$$

$$p_7=p_4+h_{7,0}d_0+h_{7,1}d_1+h_{7,2}d_2+\ldots+h_{7,11}d_{11}$$

$$p_8=p_5+h_{8,0}d_0+h_{8,1}d_1+h_{8,2}d_2+\ldots+h_{8,11}d_{11}$$

$$p_9=p_6+h_{9,0}d_0+h_{9,1}d_1+h_{9,2}d_2+\ldots+h_{9,11}d_{11}$$

$$p_{10}=p_7+h_{10,0}d_0+h_{10,1}d_1+h_{10,2}d_2+\ldots+h_{10,11}d_{11}$$

$$p_{11}=p_8+h_{11,0}d_0+h_{11,1}d_1+h_{11,2}d_2+\ldots+h_{11,11}d_{11}$$

However, when the expansion factor becomes large, then the number of columns with only one non-zero element, i.e. 1 in the example here, in the $H_p$ becomes large as well. This may have a negative effect on the performance of the code.

One remedy for this situation is to use a slightly modified dual diagonal $H_p$ matrix. This is illustrated with reference to FIG. 7 where the modified base parity check matrix 51 produces the expanded parity check matrix 52.

The parity check equations now become:

$$h_{0,0}d_0h_{0,1}d_1+\ldots+h_{0,11}d_{11}+p_0+p_3=0 \quad \text{[Equation 2]}$$

$$h_{1,0}d_0h_{1,1}d_1+\ldots+h_{1,11}d_{11}+p_1+p_4=0 \quad \text{[Equation 3]}$$

$$h_{2,0}d_0h_{2,1}d_1+\ldots+h_{2,11}d_{11}+p_2+p_5=0 \quad \text{[Equation 4]}$$

$$h_{3,0}d_0h_{3,1}d_1+\ldots+h_{3,1}d_{11}+p_0+p_3+p_6=0 \quad \text{[Equation 5]}$$

$$h_{4,0}d_0h_{4,1}d_1+\ldots+h_{4,11}d_{11}+p_1+p_4+p_7=0 \quad \text{[Equation 6]}$$

$$h_{5,0}d_0h_{5,1}d_1+\ldots+h_{5,11}d_{11}+p_2+p_5+p_8=0 \quad \text{[Equation 7]}$$

$$h_{6,0}d_0h_{6,1}d_1+\ldots+h_{6,11}d_{11}+p_6+p_9=0 \quad \text{[Equation 8]}$$

$$h_{7,0}d_0h_{7,1}d_1+\ldots+h_{7,11}d_{11}+p_7+p_{10}=0 \quad \text{[Equation 9]}$$

$$h_{8,0}d_0h_{8,1}d_1+\ldots+h_{8,11}d_1+p_8+p_{11}=0 \quad \text{[Equation 10]}$$

$$h_{9,0}d_0h_{9,1}d_1+\ldots+h_{9,11}d_{11}+p_0+p_9=0 \quad \text{[Equation 11]}$$

$$h_{10,0}d_0h_{10,1}d_1+\ldots+h_{10,11}d_{11}+p_1+p_{10}=0 \quad \text{[Equation 12]}$$

$$h_{11,0}d_0h_{11,1}d_1+\ldots+h_{11,11}d_{11}+p_2+p_{11}=0 \quad \text{[Equation 13]}$$

Now by summing up equations 2, 5, 8, and 11, the following expression is obtained:

$$(h_{0,0}+h_{3,0}+h_{6,0}+h_{9,0})d_0+(h_{0,1}+h_{3,1}+h_{6,1}+h_{9,0})d_1\ldots+(h_{0,11}+h_{3,11}+h_{6,11}+h_{9,11})d_{11}p_0+p_3+p_0+p_3+p_6+p_6+p_9+p_0+p_9=0$$

Since only $p_0$ appears an odd number of times in the equation above, all other parity check bits cancel except for $p_0$, and thus:

$$p_0=(h_{0,0}+h_{3,0}+h_{6,0}+h_{9,0})d_0+(h_{0,1}+h_{3,1}+h_{6,1}+h_{9,1})d_1+\ldots+(h_{0,11}+h_{3,11}+h_{6,11}+h_{9,11})d_{11}$$

Likewise:

$$p_1=(h_{1,0}+h_{4,0}+h_{7,0}+h_{10,0})d_0+(h_{1,1}+h_{4,1}+h_{7,1}+h_{10,1})d_0+(h_{1,11}+h_{4,11}+h_{7,11}+h_{10,11})d_{11}$$

$$p_2=(h_{2,0}+h_{5,0}+h_{8,0}+h_{11,0})d_0+(h_{2,1}+h_{5,1}+h_{87,1}+h_{11,1})d_1+\ldots+(h_{2,11}+h_{5,11}+h_{8,11}+h_{11,11})d_{11}$$

After determining $p_0$, $p_1$, $p_2$ the other parity check bits are obtained recursively:

$$p_3=h_{0,0}d_0+h_{0,1}d_1+\ldots+h_{0,11}d_{11}+p_0$$

$$p_4=h_{1,0}d_0+h_{1,1}d_1+\ldots+h_{1,11}d_{11}+p_1$$

$$p_5=h_{2,0}d_0+h_{2,1}d_1+\ldots+h_{2,11}d_{11}+p_2$$

$$p_6=h_{3,0}d_0+h_{3,1}d_1+\ldots+h_{3,11}d_{11}+p_0+p_3$$

$$p_7=h_{4,0}d_0+h_{4,1}d_1+\ldots+h_{4,11}d_{11}+p_1+p_4$$

$$p_8=h_{5,0}d_0+h_{5,1}d_1+\ldots+h_{5,11}d_{11}+p_2+p_5$$

$$p_9=h_{6,0}d_0+h_{6,1}d_1+\ldots+h_{6,11}d_{11}+p_6$$

$$p_{10}=h_{7,0}d_0+h_{7,1}d_1+\ldots+h_{7,11}d_{11}+p_7$$

$$p_{11}=h_{8,0}d_0+h_{8,1}d_1+\ldots+h_{8,11}d_{11}+p_8 \quad \text{[Equation 14]}$$

The present invention provides method and system enabling high throughput, low latency implementation of LDPC codes, and preserving the simple encoding feature at the same time.

Figures 7, 8:
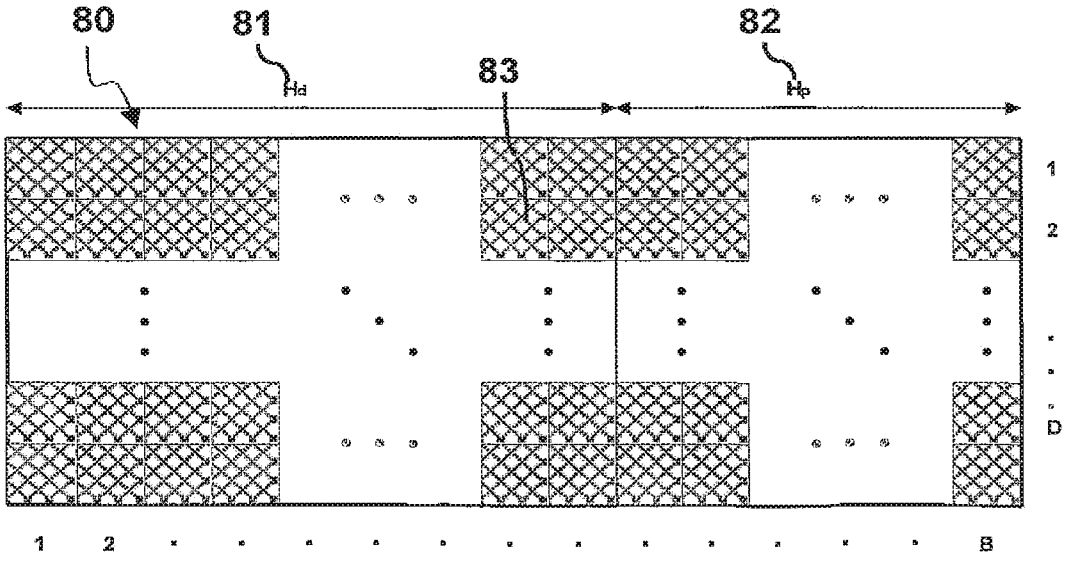
FIG. 7 is another example showing a base parity check matrix and an expanded parity check matrix.
FIG. 8 depicts a general form of the base parity check matrix of the present invention.

In accordance with one embodiment of the present invention, a general form is shown in FIG. 8 where the matrix 80 has a data portion $H_d$ 81 and a parity portion $H_p$ 82. Each of the shaded blocks 83 represents a sub-matrix. A sub-matrix may be, for example, but not limited to, a permutation matrix, a pseudo-permutation matrix or a zero matrix. When efficient encoding is required, the parity portion $H_p$ 82 of the matrix is designed such that its inverse is also a sparse matrix. Elements of the base parity check matrix and its sub-matrices may be binary or non-binary (belonging to elements of a finite Galois Field of q elements, GF(q)).

The data portion ($H_d$) may also be placed on the right side of the parity ($H_p$) portion of the parity check matrix. In the most general case, columns from $H_d$ and $H_p$ may be interchanged.

Parity check matrices constructed according to the embodiments of the present invention supports both regular and irregular types of the parity check matrix. Not only the whole matrix may be irregular (non-constant weight of its rows and columns) but also that its constituents $H_d$ and $H_p$ may be irregular, if such a partition is desired.

If the base parity check matrix is designed with some additional constraints, then base parity check matrices for different code rates may also be derived from one original base parity check matrix in one of two ways:

a. Row combining: higher rate base parity check matrices are derived from an original lower rate base parity check matrix by combining rows of the base parity check matrix. Multiple strategies can be applied in order to make the resultant higher rate base matrix maintain the properties of the original matrix, i.e. the weight of each of the column in a block of rows is at most one. One way of doing row combining will be to combine (add together) rows that belong to the same block of rows. This guarantees the preservation of column weight properties, with decrease of the block row size. Another way of row combining will be to combine the rows that belong to different blocks of rows, where they don't have overlapping elements.

b. Row splitting: lower rate base parity check matrices are derived from an original higher rate base parity check matrix by splitting rows of the base parity check matrix. The resultant lower rate parity check matrix shall maintain the properties of the original matrix, i.e. the weight of each of the column in a block of rows is at most one.

Row-combining or row-splitting, with the specific constraints defined above, allow efficient coding of a new set of expanded derived base parity check matrices. In these cases the number of layers may be as low as the minimum number of block rows (layers) in the original base parity check matrix.

Figure 9:
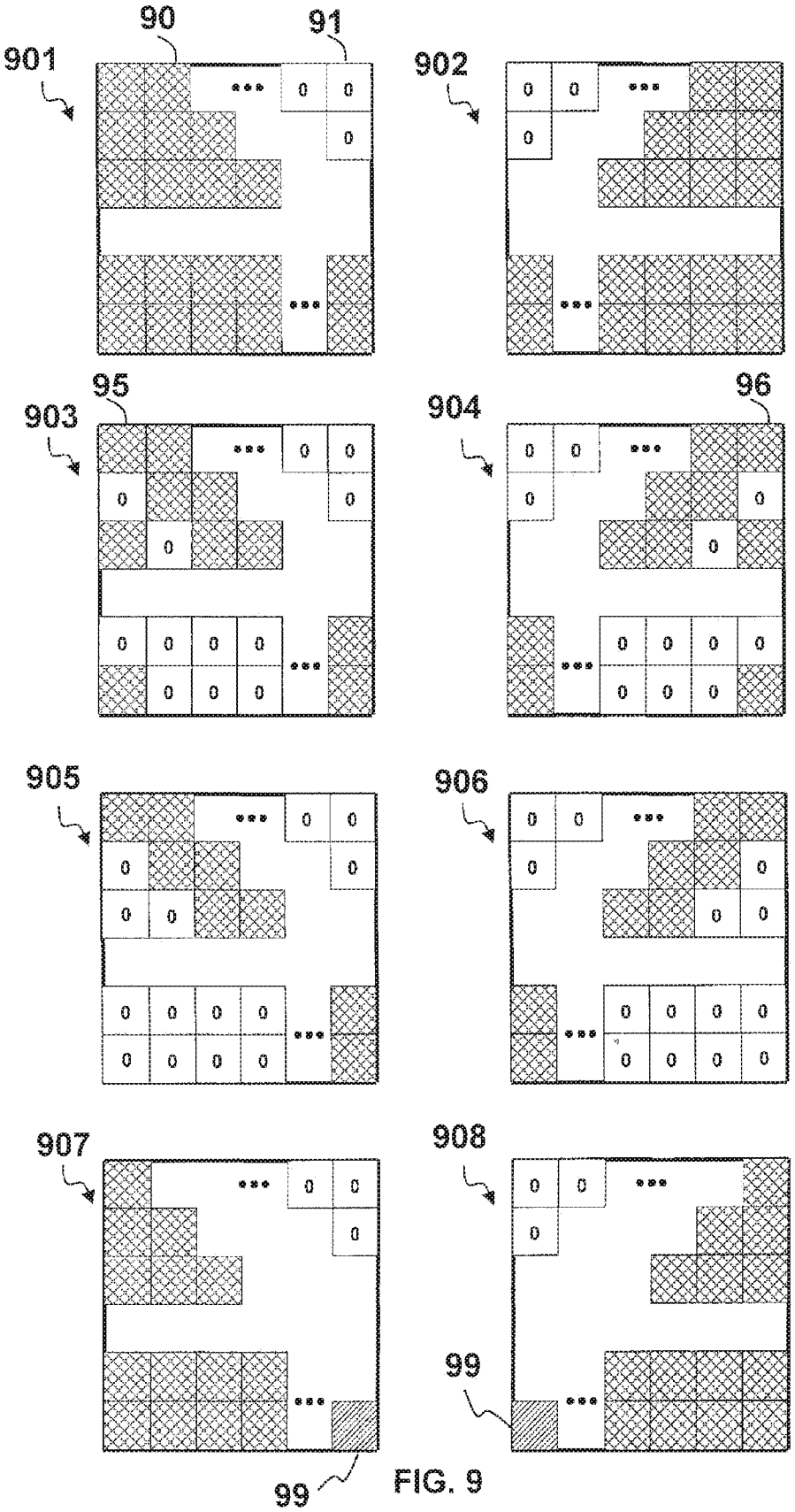
FIG. 9 gives examples of parity portion $H_p$ of the general base parity check matrix allowing efficient encoding.

FIG. 9 shows examples for parity portion $H_p$'s of these base parity check matrices allowing more efficient encoding. In each example, zero sub-matrices 91 are shown lightly shaded with a 0, and permutation (or pseudo-permutation) sub-matrices 90 are shown cross-hatched. In FIG. 9, parity portions with sub-matrices 901, 902 are examples of the embodiments of the invention. Parity portions with sub-matrices 903, 904 represent particularly interesting cases of the generalized dual diagonal form. The first column 95 of the sub-matrix of the parity portion 903, and the last column 96 of the parity portion 904 contain an odd number of sub-matrices in order to ensure the existence of the inverse matrix of $H_p$. The other columns each contain two sub-matrices in pairs, forming a "staircase", which ensures efficient recursive encoding. These constructions of $H_p$ can be viewed as generalized cases, where $H_p$ consists of a dual diagonal and an odd-weight column (such as the matrix 60 in FIG. 4), which may be symbolically expressed as:

$$H_{p,present_invention}(m)=T\ (H_{p,existing},m),$$

Where T is the transform describing the base parity check matrix expansion process and m is the size of the permutation matrices. For m=1, $H_p$ of the present invention defines the form of the prior art $H_p$ (dual diagonal with the odd-weight column), i.e.

$$H_{p,present_invention}(1)=T\ (H_{p,existing},1)=H_{p,existing}$$

A further pair of parity portions with sub-matrices 905, 906 illustrate cases where these first and last columns, respectively, have only one sub-matrix each.

The two parity portions with sub-matrices 907, 908 in FIG. 9 illustrate lower and upper triangular structure, also thus permit efficient recursive encoding. However, in order to solve the weight-1 problem, the sub-matrices 99 (shown hatched) in each example have the weight of all columns equal to 2, except the last one, which has weight equal to 1.

One of the characteristics of the base parity check matrix expansion of the present invention is that the expanded base parity check matrix inherits structural features from the base parity check matrix. In other words, the number of blocks (rows or columns) that can be processed in parallel (or serial, or in combination) in the expanded parity check matrix equals the number of blocks in the base parity check matrix.

Figure 10:
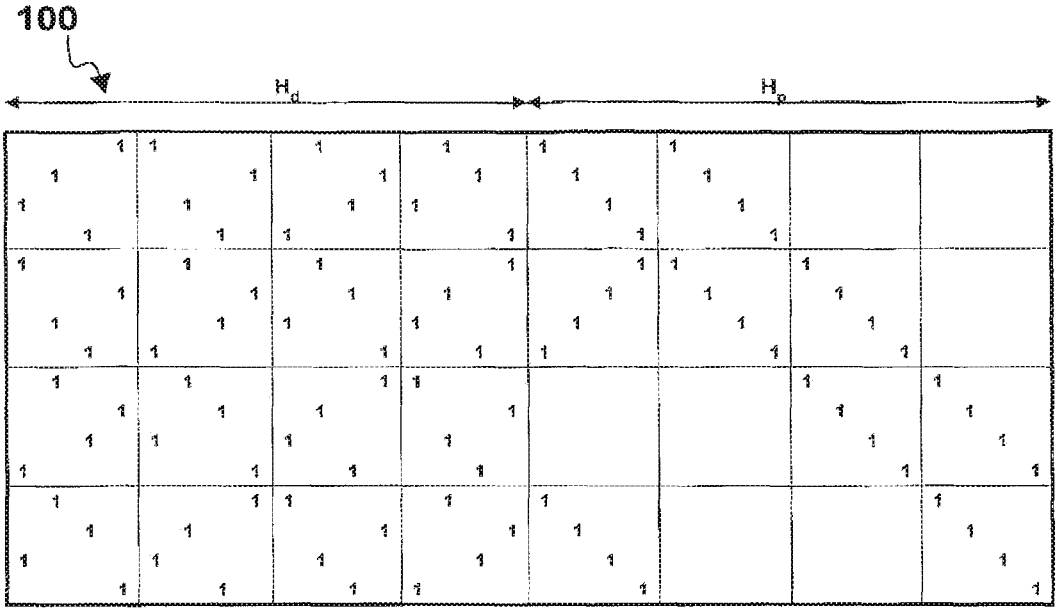
FIG. 10 is an example of a fully structured base parity check matrix, showing sub-matrices arranged as blocks.

Referring to FIG. 10, matrix 100 representing one possible realization of a rate R=½ base parity check matrix based on the structure of the matrix 80 of FIG. 8. In the matrix 100, only non-zero elements (1's in this example) are indicated and all blanks represent 0's. The parity check matrix comprises D rows that may be processed in parallel (D=4 for matrix 100). Each row can be further split into a number of columns, B (B=8 for matrix 100). Therefore, the whole base parity check matrix 100 can be envisioned as comprising D rows and B columns of sub-matrices. Examples of the sub-matrices may be, but not limited to, permutation sub-matrices, pseudo-permutation sub-matrices or zero sub-matrices. Furthermore, it is not necessary that the sub-matrices are square sub-matrices, although in this example all sub-matrices are m×m square sub-matrices.

Figure 11:
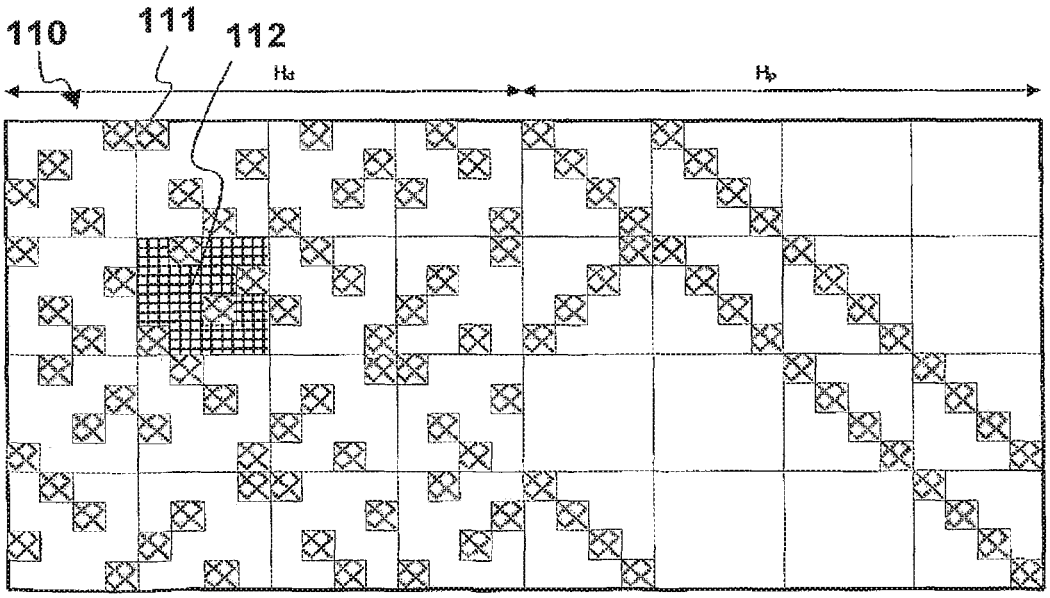
FIG. 11 is an expanded parity check matrix from sub-matrices of the fully structured base parity check matrix of FIG. 10.

The base parity check matrix 100 of FIG. 10 is shown as an expanded parity check matrix 110 in FIG. 11. In this example, each non-zero element is replaced by a L×L sub-matrix, for example a permutation sub-matrix, and each zero is replaced by an L×L zero sub-matrix of which the smaller square 111 is an example.

It can be seen that expanded parity check matrix 110 has inherited structural properties of its base parity check matrix 100 from FIG. 10. That means that in the expanded sub-matrix blocks (of which 112 is an example) can be considered as having the same sub-matrices as before the expansion, for example, permutation, or all zero sub-matrices. This property offers implementation advantages.

The sub-matrices of the present invention are not limited to permutation sub-matrices, pseudo-permutation sub-matrices or zero sub-matrices. In other words, the embodiments of the present invention are not restricted to the degree distribution (distribution of column weights) of the parity check matrix, allowing the matrix to be expanded to accommodate various information packet sizes and can be designed for various code rates. This generalization is illustrated through following examples.

Figure 12:
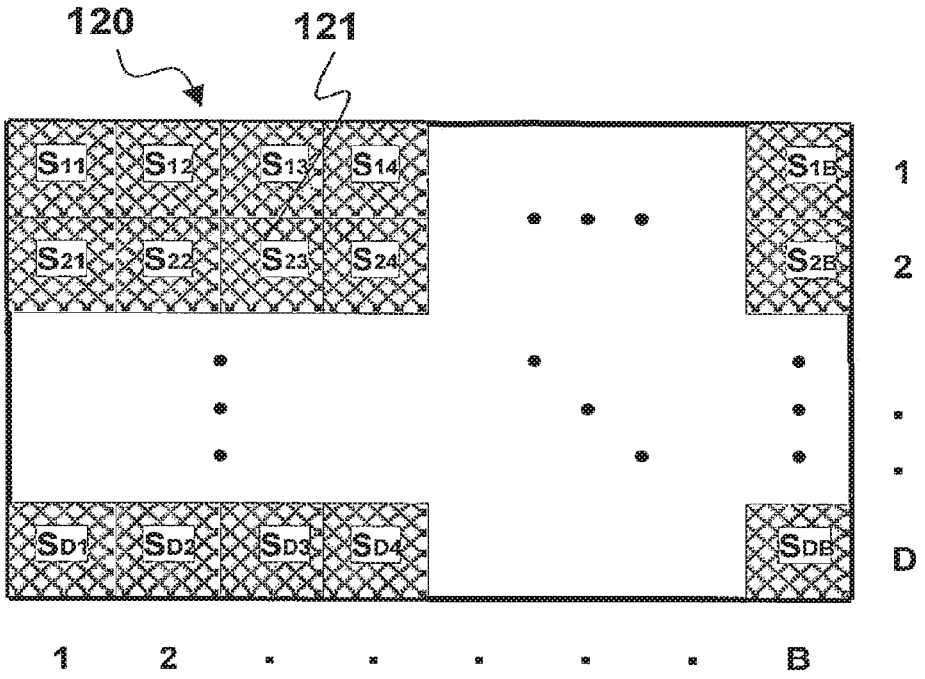
FIG. 12 illustrates the general form of the parity check matrix of the present invention.

FIG. 12 shows a general form of a parity check matrix 120. Cross-hatched blocks, of which 121 is an example, represent sub-matrices S, which may be, in the most general form, rectangular. In addition, these sub-matrices 121 may further comprise a set of smaller sub-matrices of different size. As discussed before, elements of the parity check matrix and its sub-matrices may be binary or non-binary (belonging to elements of a finite Galois Field of q elements, GF(q)).

Figure 13:
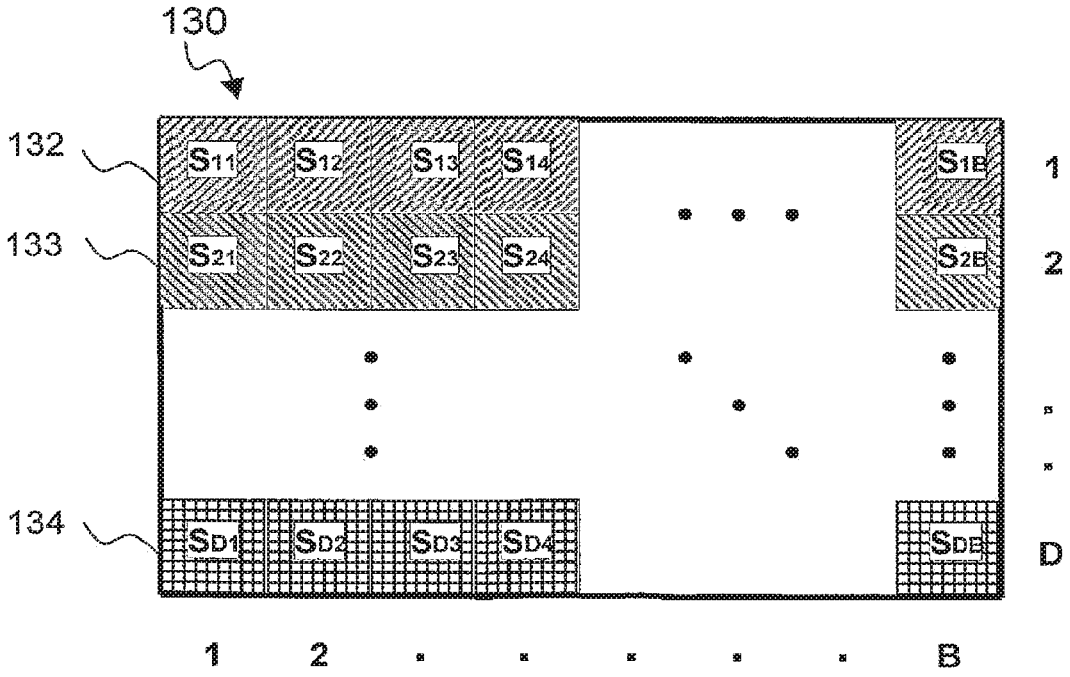
FIG. 13 shows a parity check matrix with outlined layers for the layered belief propagation decoding.

FIG. 13 shows a parity check matrix 130 having rows corresponding to different layers l to D, of which 132, 133, 134 are examples.

In the context of parallel row processing, layered belief propagation decoding is next briefly described with reference to FIGS. 13 and 14.

Figure 14:
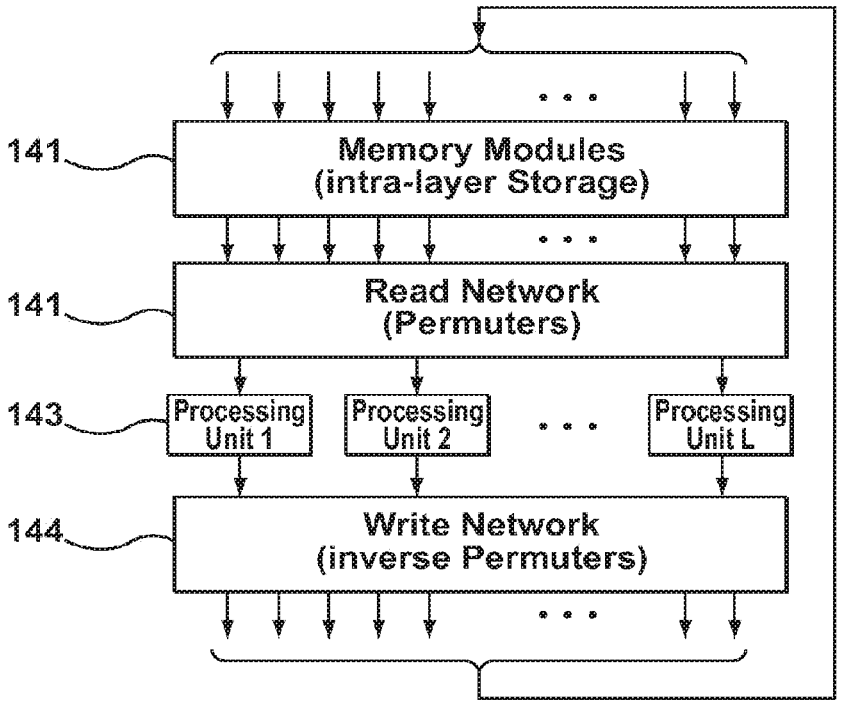
FIG. 14 (PRIOR ART)
FIG. 14 gives the high level hardware architecture implementing existing method of layered belief propagation decoding.

A high level architectural block diagram is shown in FIG. 14 for the parallel row processing scenario comprising memory modules 141, connected to a read network 142 (using permuters). These permuters are in turn connected to a number of processing units 143 whose outputs are directed to a write network 144 (using inverse permuters). In this scenario, each iteration of the belief propagation decoding algorithm consists of processing D layers (groups of rows). This approach therefore updates the decoding variables corresponding to a particular layer depends on the equivalent variables corresponding to all other layers.

Figure 15:
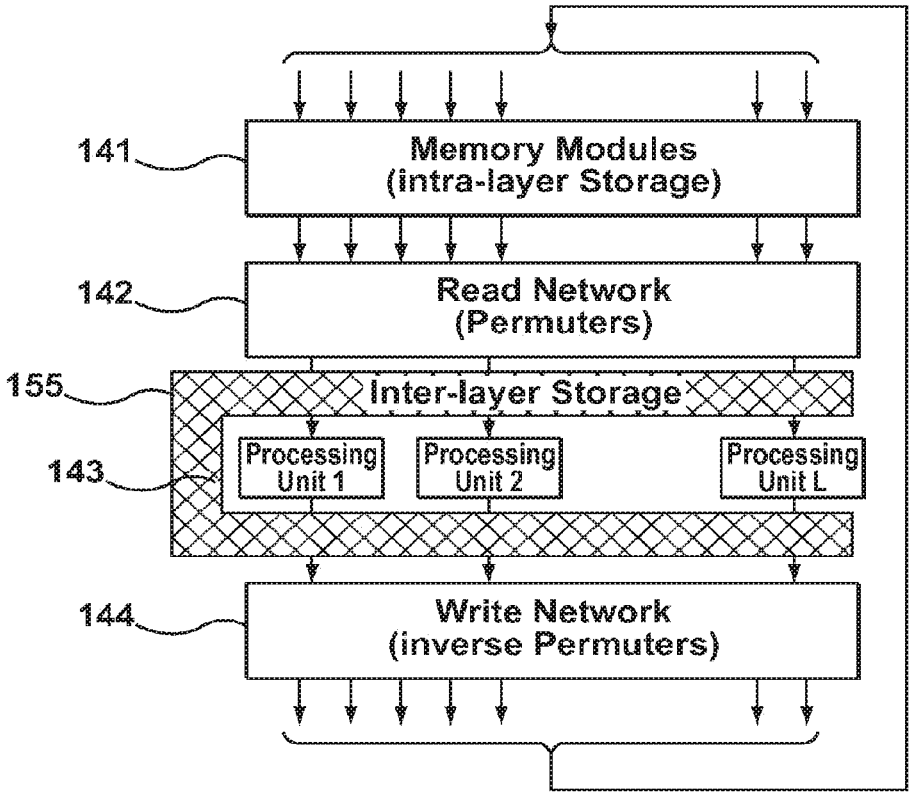
FIG. 15 is an example of the high level hardware architecture implementing layered belief propagation decoding in accordance with one embodiment of the present invention.

In order to support a more general approach in accordance with an embodiment of the present invention, the architecture of FIG. 14 may be modified. One example of such a modification is depicted in FIG. 15 where the extra inter-layer storage element 155 is shown. In this new architecture additional storage of inter-layer variables is also required—the function being provided by the element 155. This change enables an increased level of parallelism beyond the limits of existing approach.

By exercising careful design of the parity check matrix, the additional inter-layer storage 155 in FIG. 15 can be implemented with low complexity. One such approach is discussed below.

Iterative parallel decoding process is best described as read-modify-write operation. The read operation is performed by a set of permuters, which deliver information from memory modules to corresponding processing units. Parity check matrices, designed with the structured regularity described earlier, allow efficient hardware implementations (e.g., fixed routing, use of simple barrel shifters) for both read and write networks. Memory modules are organized so as to provide extrinsic information efficiently to processing units.

Processing units implement block (layered) decoding (updating iterative information for a block of rows) by using any known iterative algorithms (e.g. Sum Product, Min-Sum, Bahl-Cocke-Jelinek-Raviv (BCJR)).

Inverse permuters are part of the write network that performs the write operation back to memory modules.

Such parallel decoding is directly applicable when the parity check matrix is constructed based on permutation, pseudo-permutation or zero sub-matrices.

Figure 16:
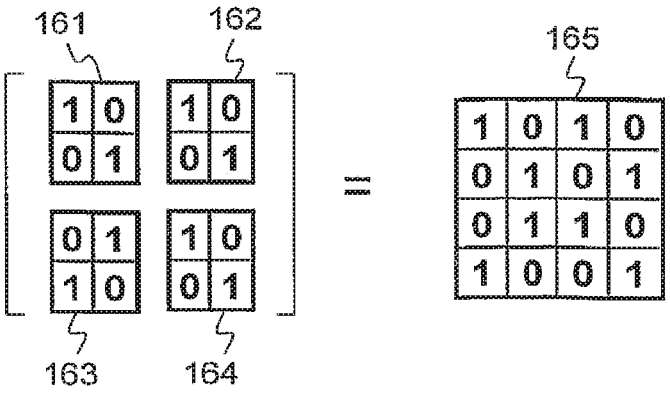
FIG. 16 shows a sub-matrix construction by concatenation of permutation matrices.

To encode using sub-matrices other than permutation, pseudo-permutation or zero sub-matrices, one embodiment of the present invention uses special sub-matrices. A sub-matrix can also be constructed by concatenation of smaller permutation or pseudo-permutation matrices. An example of this concatenation is illustrated in FIG. 16, in which the four small sub-matrices 161, 162, 163, 164 are concatenated into the sub-matrix 165.

Parallel decoding is applicable with the previously described modification to the methodology; that is, when the parity check matrix includes sub-matrices built by concatenation of smaller permutation matrices.

Figure 17:
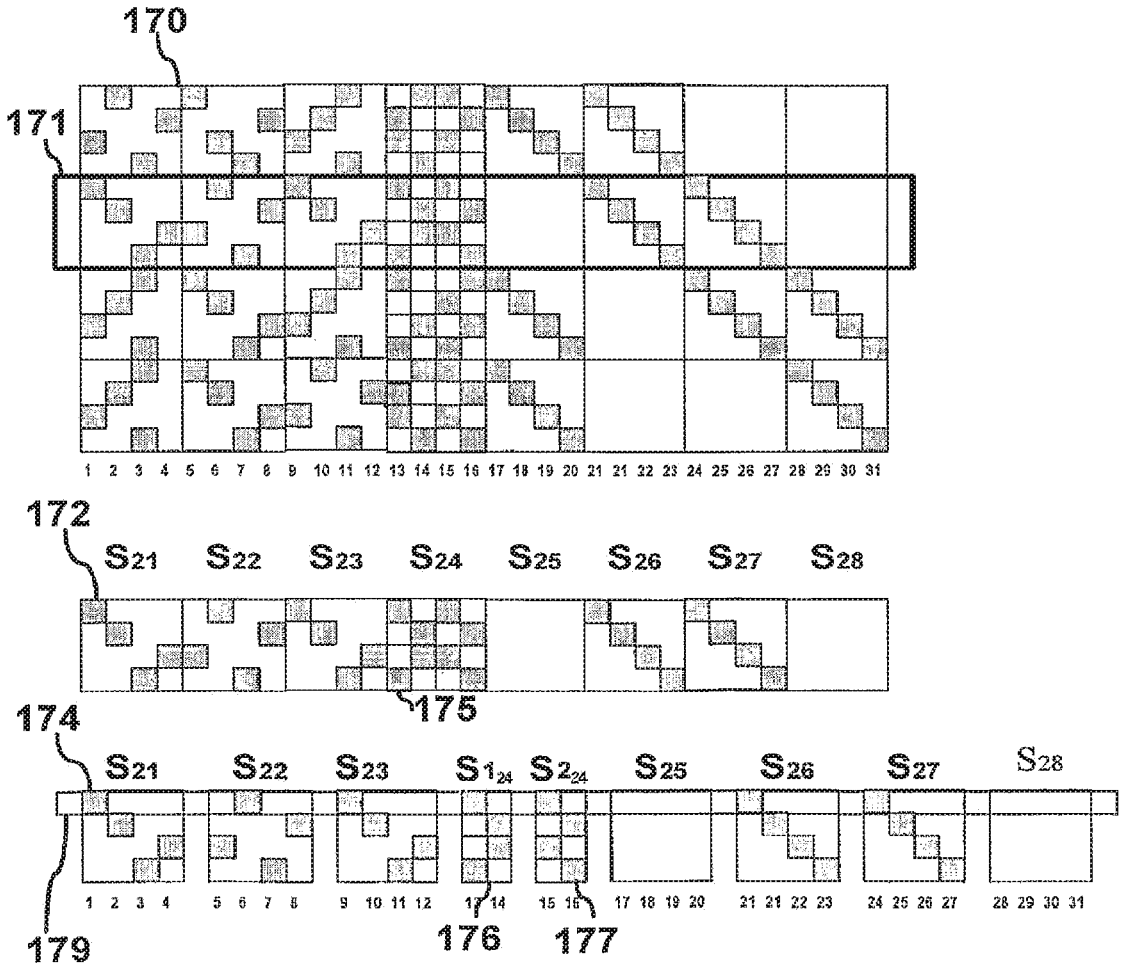
FIG. 17 is an example of parallel decoding with concatenated permutation matrixes.

FIG. 17 illustrates such a base matrix 170. The decoding layer 171 includes permutation sub-matrices 172 $S_{21}$, $S_{22}$, $S_{23}$, $S_{26}$, $S_{27}$, sub-matrix $S_{24}$ (built by concatenation of smaller permutation matrices), and zero sub-matrices $S_{25}$, and $S_{28}$. The decoding layer 171 is shown 174 with the sub-matrix $S_{24}$ split vertically into $S^1_{24}$ 176 and $S^2_{24}$ 177.

It can be seen that for the decoding layer 171 a first processing unit receives information in the first row 179 from bit 1 (according to $S_{21}$), bit 6 ($S_{22}$), bit 9 ($S_{23}$), bit 13 ($S^1_{24}$), bit 15 ($S^2_{24}$), bit 21 ($S_{28}$), and bit 24 ($S_{29}$). Other processing units are loaded in a similar way.

For layered belief propagation type decoding algorithms, the processing unit inputs extrinsic information accumulated, by all other layers, excluding the layer currently being processed. Thus, the prior art implementation described using FIG. 14 presents the processing unit with all the results accumulated by other decoding layers. The only bits that require modification in order to satisfy this requirement are bits from $S^1_{24}$ 176 and $S^2_{24}$ 177, which are referred to as special bits. To provide complete extrinsic information about these special bits to a processing unit, an output must be added from other variable nodes within the current layer (inter-layer results) as described previously with respect to FIG. 15 where the interlayer storage element 155 was introduced.

Figure 18:
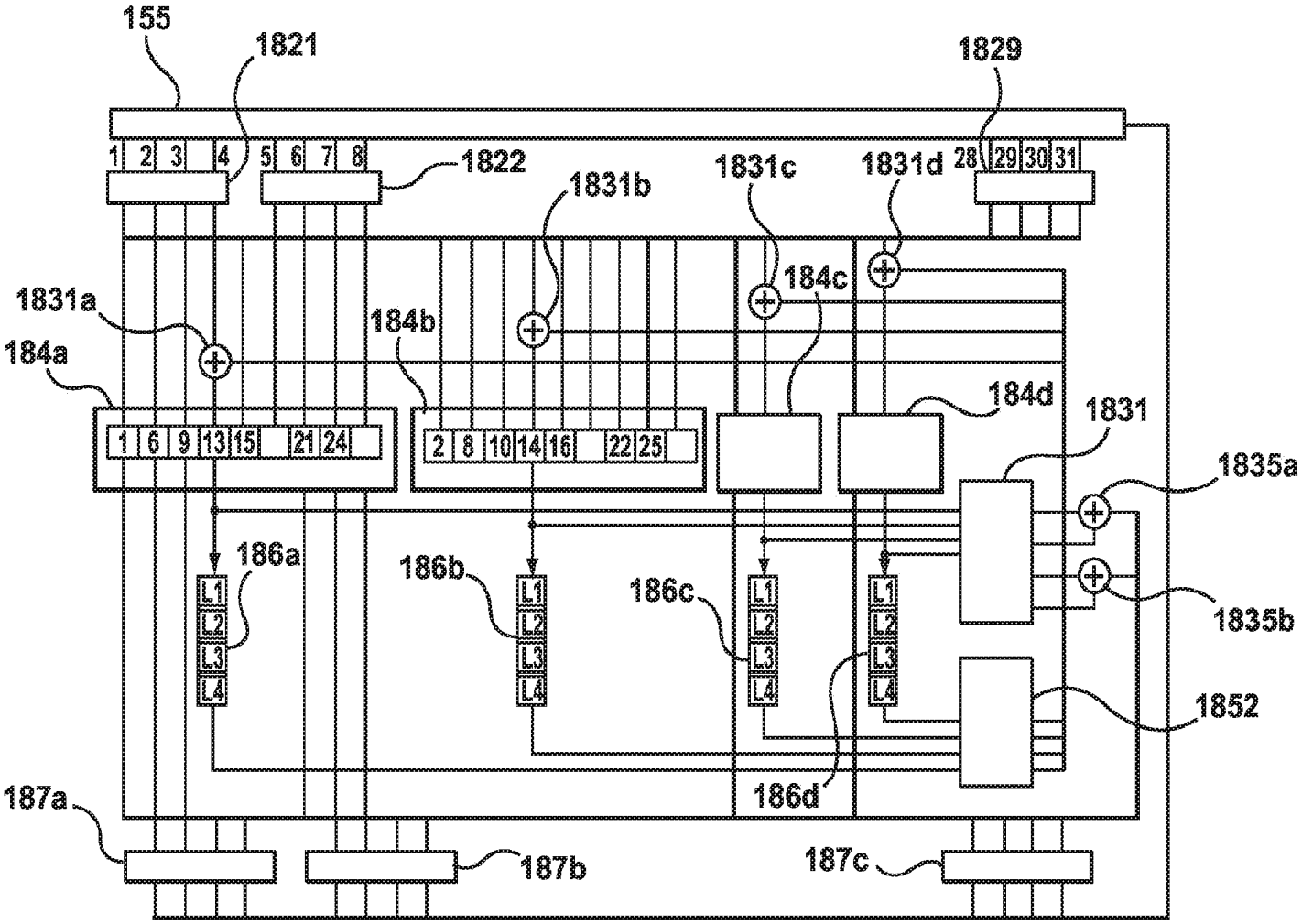
FIG. 18 is an example of modifications supporting parallel decoding when sub-matrices are built from concatenated smaller permutation matrices.

This is illustrated in FIG. 18 in which additional memory modules 155 used for interlayer storage are shown, and which provide interlayer extrinsic information to permuters 1821, 1822, 1829. For the special bits the additional storage for inter-layer information comprises the delay lines 186. Processing units 184a-184d, each programmed to correspond with a row 179 of the current decoding layer 174, provide inputs to delay lines 186. A first further permuter 1851 is applied to choose a pair of processing units 184 that operate with same special bit. A second further permuter 1852 chooses a processing unit's "neighbor"—namely one that operates with same special bit at the current decoding layer. Adders 1831a-1831d combine intra-layer information with inter-layer results from the second further permuter 1852. Outputs from the first further permuter 1851 are combined using adders 1835a and 1835b whose outputs enter the inverse permuters 187 as well as all other "normal" (i.e. non-special bits) bits output from each processing unit 184. The outputs from the inverse permuters 187 are written back to the memory modules 155 (intra-layer storage). Processing continues for the complete code matrix 170, taking each layer 174 in turn.

For simplicity, FIG. 18 shows details of modifications for special bits coming from $S^1_{24}$ 176. The analogous modifications for $S^2_{24}$177 are also included in embodiments of the invention.

Improvement in throughput, and reduction in latency in accordance to an embodiment of the present invention is further illustrated by the following example.

The LDPC codes can be decoded using several methods. In general, iterative decoding is applied. The most common is the sum-product algorithm (SPA) method. Each iteration in SPA comprises two steps:

a. horizontal step, during which all row variables are updated at the same time based on the column variables; and
b. vertical step, during which all column variables are updated at the same time based on row variables.

It has been shown that better performance, in terms of the speed of convergence, can be achieved with layered decoding. In layered decoding only row variables are updated for a block of rows, one block row at a time. The fastest approach is to process all the rows within a block of rows simultaneously.

The following is a comparison of the achievable throughput (bit rate) of two LDPC codes: one based on the existing method for expanding matrix, as described in FIG. 5, and the other based on the matrix of the present invention as described in FIG. 17. Throughput in bits per second (bps) is defined as:

$$T=(K\times F)/(C\times I),$$

where K is number of info bits, F is clock frequency, C is number of cycles per iteration, and I is the number of iterations. Assuming that K, F, and I are fixed and, for example, equal: K=320 bits, F=100 MHz, and I=10, the only difference between the existing method and the present invention is derived from C, the factor which is basically a measure of the level of allowed parallelism. It can be seen, by comparing FIG. 5 and FIG. 17, that the number of rows is the same in both cases ($M_b$=16). Assuming that the expanded parity check matrices are also the same size, and the same payload of, for example, K=320 bits can also be handled, an expansion factor of 20 (L=320/16) will be required. The maximum number of rows that can be handled in parallel is L (=20) for the matrix of FIG. 5, whereas the number of rows for parallel operation in the case of FIG. 17 is 4×20=80. Thus the number of cycles per iteration, C, is given as follows:

$$C_{existing}=16 \text{ and } C_{present_invention}=4.$$

Using these numbers in the formula gives:

$$T_{max,existing}=200 \text{ Mbps}$$

$$T_{max,present_invention}=800 \text{ Mbps}$$

As expected, the maximum throughput is 4 times greater. All the desirable features of the code design in terms of efficient encoding are preserved. For example, without degradation in performance, the encoding algorithm as described earlier with respect to FIG. 2, and the corresponding efficient encoder architecture still apply.

Furthermore, when a scaleable solution is desired, the size of the expanded LDPC parity check matrix is designed to support the maximum block size. The existing solutions do not scale well with respect to the throughput for various block sizes. For example, using the existing method for layered decoding, processing of short and long blocks takes the same amount of time. This is caused by the fact that for shorter blocks, not all processing units are used, resulting proportionally lower achieved throughput.

The following example is based on the same example as before by comparing matrices as described earlier in FIG. 5 and FIG. 17. One embodiment of the present invention allows the splitting of a block of rows into smaller stripes, and still has a reasonably low number of cycles per layered decoding iteration. The existing architecture does not allow this splitting without increasing decoding time beyond a reasonable point.

Figure 19:
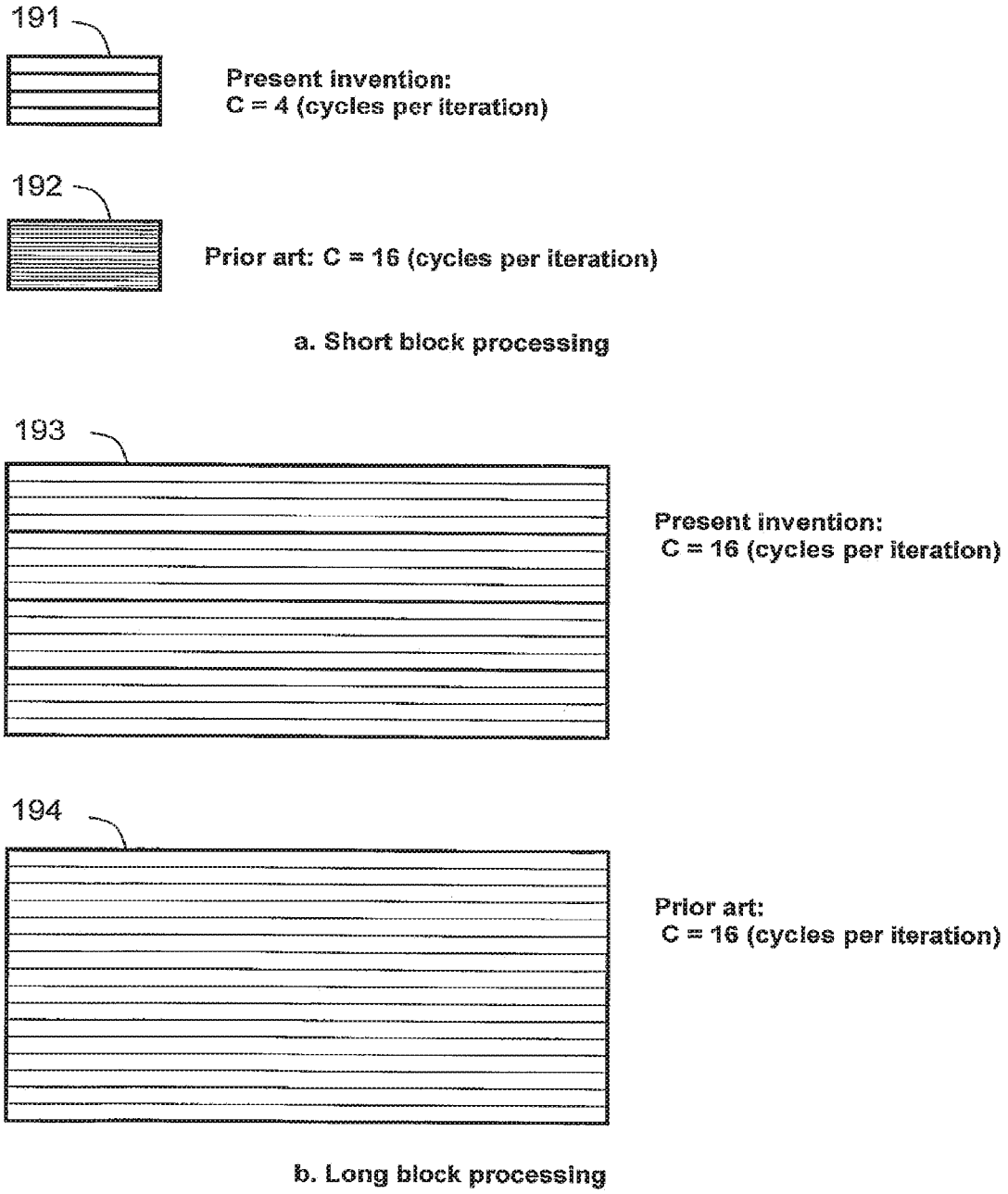
FIG. 19 illustrates short and long information blocks processing.

FIG. 19 illustrates the difference between the prior art method and the method in accordance with one embodiment of the present invention. The blocks 191 and 192 represent short blocks as processed by one embodiment of the present invention and in the existing method, respectively. In the case using the embodiment of the present invention only 4 cycles are required per iteration, whereas prior art implementations require 16 cycles. This represents a considerable savings in processing. For comparison, blocks 193 and 194 represent long blocks as processed by the present invention and in the prior art respectively, where as expected the savings are not made.

The following table compares the computed results.

| | Codeword size | C | Number of processing units | Throughput (Mbps) |
|---|---|---|---|---|
| Existing (FIG. 5) | 320 | 16 | 20 | 200 |
| | 1280 | 16 | 80 | 800 |
| Embodiment of present invention (FIG. 17) | 320 | 4 | 80 | 800 |
| | 1280 | 16 | 80 | 800 |

It can be seen from the table that the embodiment of the present invention provides constant throughput independent on the codeword size, whereas in the case of the existing method the throughput for the smaller blocks drops considerably. The reason is that while the embodiment of the present invention fully utilizes all available processing resources irrespective of block size, the existing method utilizes all processing units only in the case of the largest block, and a fraction of the total resources for other cases.

The example here illustrating the throughput improvement for shorter blocks, leads also to the conclusion that reduced latency is also achieved with the embodiment of the present invention. When large blocks of data are broken into smaller pieces, the encoded data is split among multiple codewords. If one places a shorter codeword at the end of series of longer codewords, then the total latency depends primarily on the decoding time of the last codeword. According to the table above, short blocks require proportionally less time to be decoded (as compared to the longer codewords), thereby allowing reduced latency to be achieved by encoding the data in suitably short blocks.

In addition to the full hardware utilization illustrated above, embodiments of the present invention allow hardware scaling, so that short blocks can use proportionately less hardware resources if an application requires it.

Furthermore, utilization of more efficient processing units and memory blocks is enabled. Memory can be organized to process a number of variables in parallel. The memory can therefore, be partitioned in parallel.

The present invention provides new LPDC base parity matrices, and expanded matrices based on the new base parity matrices, and method for use thereof.

The locations of non-zero matrices for rate R in an exemplary matrix are chosen, so that:

a) parity part ((1−R)*24 rightmost columns) of the matrix is designed to allow simple encoding algorithms;
b) weights of all columns in the data portion of base parity check matrix is uniform;
c) weights of all rows in the data portion of a base parity check matrix is uniform;
d) the parity part of the matrix allows simple encoding algorithms. For example, the encoding algorithm based on equation 1, or equation 14.

An example of R=¾ base parity check matrix design using criteria a) to d) is:

| | | | | | | | | | | | | | | | | | | | | | | | |
|---|---|---|---|---|---|---|---|---|---|---|---|---|---|---|---|---|---|---|---|---|---|---|---|
| 1 | 1 | 1 | 1 | 0 | 0 | 0 | 1 | 1 | 0 | 1 | 0 | 1 | 1 | 1 | 1 | 0 | 1 | 1 | 1 | 0 | 0 | 0 | 0 |
| 1 | 1 | 1 | 1 | 0 | 1 | 1 | 0 | 1 | 0 | 0 | 1 | 0 | 1 | 1 | 1 | 1 | 0 | 0 | 1 | 1 | 0 | 0 | 0 |
| 1 | 0 | 1 | 0 | 1 | 1 | 1 | 1 | 0 | 1 | 0 | 0 | 1 | 0 | 1 | 1 | 1 | 1 | 0 | 0 | 1 | 1 | 0 | 0 |
| 1 | 1 | 0 | 1 | 1 | 1 | 1 | 1 | 0 | 1 | 1 | 1 | 0 | 0 | 0 | 0 | 1 | 1 | 1 | 0 | 0 | 1 | 1 | 0 |
| 0 | 0 | 0 | 0 | 1 | 1 | 1 | 1 | 1 | 1 | 1 | 1 | 1 | 1 | 1 | 1 | 0 | 0 | 0 | 0 | 0 | 0 | 1 | 1 |
| 0 | 1 | 1 | 1 | 1 | 0 | 0 | 0 | 1 | 1 | 1 | 1 | 1 | 1 | 0 | 0 | 1 | 1 | 1 | 0 | 0 | 0 | 0 | 1 |

The rate R=¾ matrix definition built based on such base parity check matrix covers expansion factors in the range L between 24 and $L_{max}$=96 in increments of 4. Right circular shifts of the corresponding L×L identity matrix $s'_{ij}$, are determined as follows:

$$s'_{ij} = \begin{cases} \text{floor}\left(\frac{L \times s_{ij}}{L_{max}}\right), & s_{ij} > 0 \\ s_{ij}, & \text{otherwise,} \end{cases}$$

where $s_{ij}$ is specified in the matrix definition below:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 92 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 56 | 16 | 71 | 53 | −1 | −1 | 27 | 26 | 48 | −1 | −1 | −1 | −1 | 0 |

The present invention further enables flexible rate adjustments by the use of shortening, or puncturing, or a combination thereof. Block length flexibility is also enabled through expansion, shortening, or puncturing, or combinations thereof.

Any of these operations can be applied to the base or expanded parity check matrices.

Figure 20:
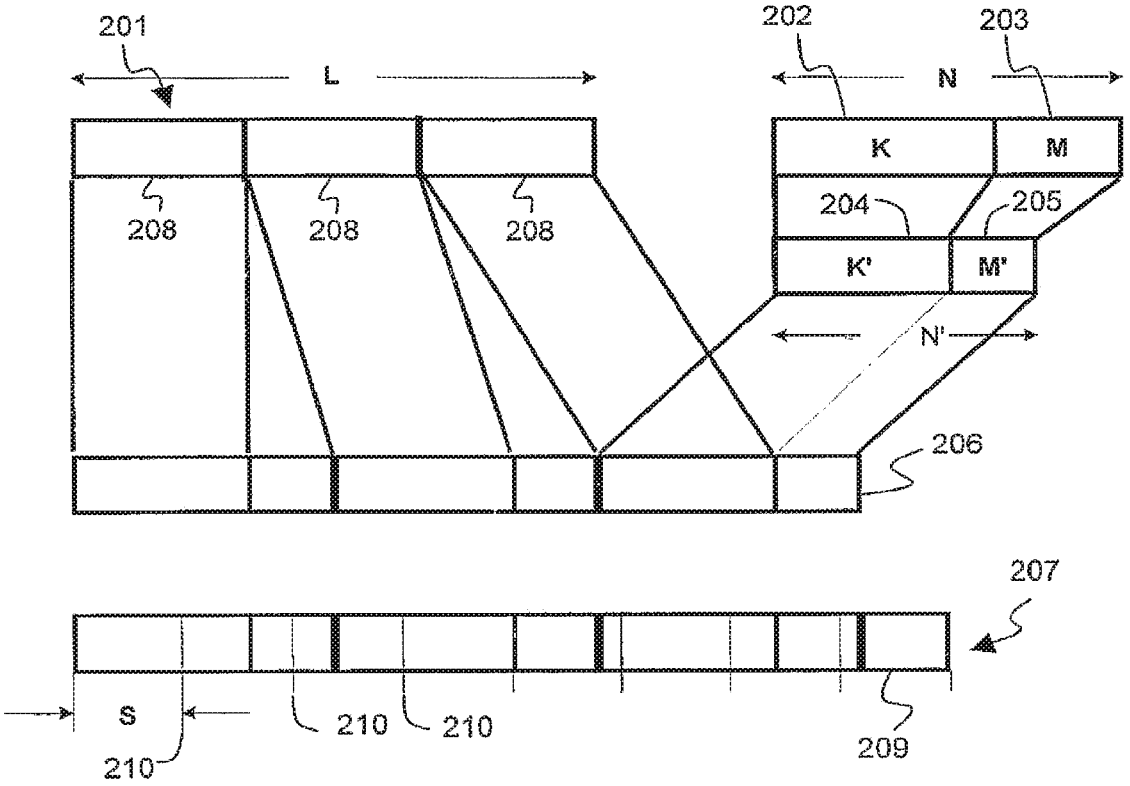
FIG. 20 illustrates encoding of data packets, using puncturing and shortening.

Referring to FIG. 20, a data packet of length L is required to be encoded using an LDPC code (N, K), as previously presented, K 202 is the information block size, N is the length of the codeword, and M 203 is the number of parity check bits, M=N−K. The encoded data is to be transmitted using a number of modulated symbols, each carrying S bits.

The data packet 201 of length L is divided into segments 208. These segments are in turn encoded using an LDPC code (N, K). The information block K 202 may be optionally pruned to K' 204; and the parity check bits M may be pruned to M' 205. The term "pruning" is intended to mean applying code shortening by sending less information bits than possible with a given code, (K'<K). The term "puncturing" is intended to mean removing some of the parity bits and/or data bits prior to sending the encoded bits to the modulator block and subsequently over the channel. Pruned codewords may be concatenated 206 in order to accommodate the encoded data packet, and the resulting stream 207 is padded with bits 209 to match the boundaries 210 of modulated symbols before being sent to the modulator. The amount of shortening and puncturing may be different for the constituent pruned codewords. The objectives here are:

(a) Keep the performance in terms of coding gain as high as possible. This objective translates into the following needs:

Select the largest suitable codeword from the available set of codewords. For the LDPC codes and other block codes, the longer the codeword the more coding gain can be achieved, although at certain codeword size the point of diminishing return is reached.

Adjust properly the amount of shortening and puncturing, as this directly affects the performance, and the efficiency of the transmission.

(b) Use as few of the modulated symbols as possible. This in turn means that it is desirable to utilize transmit power economically. This is especially important for battery operated hand-held wireless devices by keeping the air time at minimum.

(c) Keep the overall complexity at a reasonable level. This usually translates into a requirement to operate with a relatively small set of codewords in different sizes. In addition, it is desirable to have a code designed in such a way that various codeword lengths can be implemented efficiently. Finally, the actual procedure defining concatenation rules should be simple.

From objective (a) above it follows that in order to use a small number of codewords, an efficient shortening and puncturing operation needs to be applied. However, those operations have to be implemented in a way that would neither compromise the coding gain advantage of LDPC codes, nor lower the overall transmit efficiency unnecessarily. This is particularly important when using the special class of LDPC parity check matrices that enable simple encoding operation, for example, as the one describe in the previous embodiments of the present invention. These special matrices employ either a lower triangular, a dual-diagonal, or a modified dual-diagonal in the parity portion of the parity check matrix corresponding. An example of a dual-diagonal matrix is described earlier in FIG. 3 in which the parity portion $H_p$ 32 corresponds to the parity bits, and the data portion $H_d$ 31 to the information data bits.

Work to achieve efficient puncturing has been done using the "rate compatible" approach. One or more LDPC parity check matrix is designed for the low code rate application. By applying the appropriate puncturing of the parity portion, the same matrix can be used for a range of code rates which are higher than the original code rate as the data portion in relation to the codeword increases. These methods predominantly target applications where adaptive coding (e.g. hybrid automatic repeat request, H-ARQ) and/or unequal bit protection is desired.

Puncturing may also be combined with code extension to mitigate the problems associated with "puncturing only" cases. The main problem that researchers are trying to solve here is to preserve an optimum degree distribution through the process of modifying the original parity check matrix.

However, these methods do not directly address the problem described earlier: apply shortening and puncturing in such a way that the code rate is approximately the same as the original one, and the coding gain is preserved.

One method attempting to solve this problem specifies shortening and puncturing such that the code rate of the original code is preserved. The following notation is used:

$N_{punctured}$—Number of punctured bits, $N_{shortened}$—Number of shortened bits.

Shortening to puncturing ratio, q, is defined as: $q=N_{shortened}/N_{punctured}$.

In order to preserve the same code rate, q has to satisfy the following equation:

$$q_{rate_preserved}=R/(1-R)$$

Two approaches are prescribed for choosing which bits to shorten and which to puncture to reach a shortening and a puncturing pattern.

Two approaches for shortening and puncturing of the expanded matrices are described in Dale Hocevar and Anuj Batra, "Shortening and Puncturing Scheme to Simplify LDPC Decoder Implementation," Jan. 11, 2005, a contribution to the informal IEEE 802.16e LDPC ad-hoc group, the entirely of the document is incorporated herein by reference. These matrices are generated from a set of base parity check matrices, one base parity check matrix per code rate. The choice depends on the code rate, i.e. on the particular parity check matrix design.

The method may preserve the column weight distribution, but may severely disturb the row weight distribution of the original matrix. This, in turn, causes degradation when common iterative decoding algorithms are used. This adverse effect strongly depends on the structure of the expanded matrix.

This suggests that this approach fails to prescribe general rules for performing shortening and puncturing, and has an unnecessary restriction for a general case such as the one described in FIG. 20. Namely, accepting some reduction in the code rate in order to keep the performance in terms of the coding gain at a certain level.

In general, the amount of puncturing needs to be limited. Extensive puncturing beyond certain limits paralyzes the soft decision decoder. Prior art methods, none of which specify a puncturing limit or alternatively offer some other way for mitigating the problem, may potentially compromise the performance significantly.

In accordance with another embodiment of the present invention, above described shortcomings may be addressed by:

(a) specifying general rules for shortening and puncturing patterns;

(b) providing mechanism for $q > q_{rate_preserved}$;

(c) establishing a limit on the amount of puncturing; and (d) providing an algorithmic method for finding the optimal solution within the range of given system parameters.

This embodiment of the present invention may be beneficially applied to both the transmitter and the receiver. Although developed for wireless systems, embodiments of the invention can be applied to any other communication system which involves encoding of variable size data packets by a fixed error correcting block code.

The advantage of this invention can be summarized as providing an optimal solution to the above described problem given the range of the system parameters such as the performance, power consumption, and complexity. It comprises the following steps:

1. Based on the data packet size determine the minimum number of required modulated symbols;
2. Select the codeword length from the set of available codeword lengths;
3. In an iterative loop determine required amount of shortening and puncturing and corresponding estimated performance and add additional modulated symbol(s), if necessary;
4. Distribute amount of shortening and puncturing across all constituent codewords efficiently; and
5. Append padding bits in the last modulated symbol if necessary.

Figure 21:
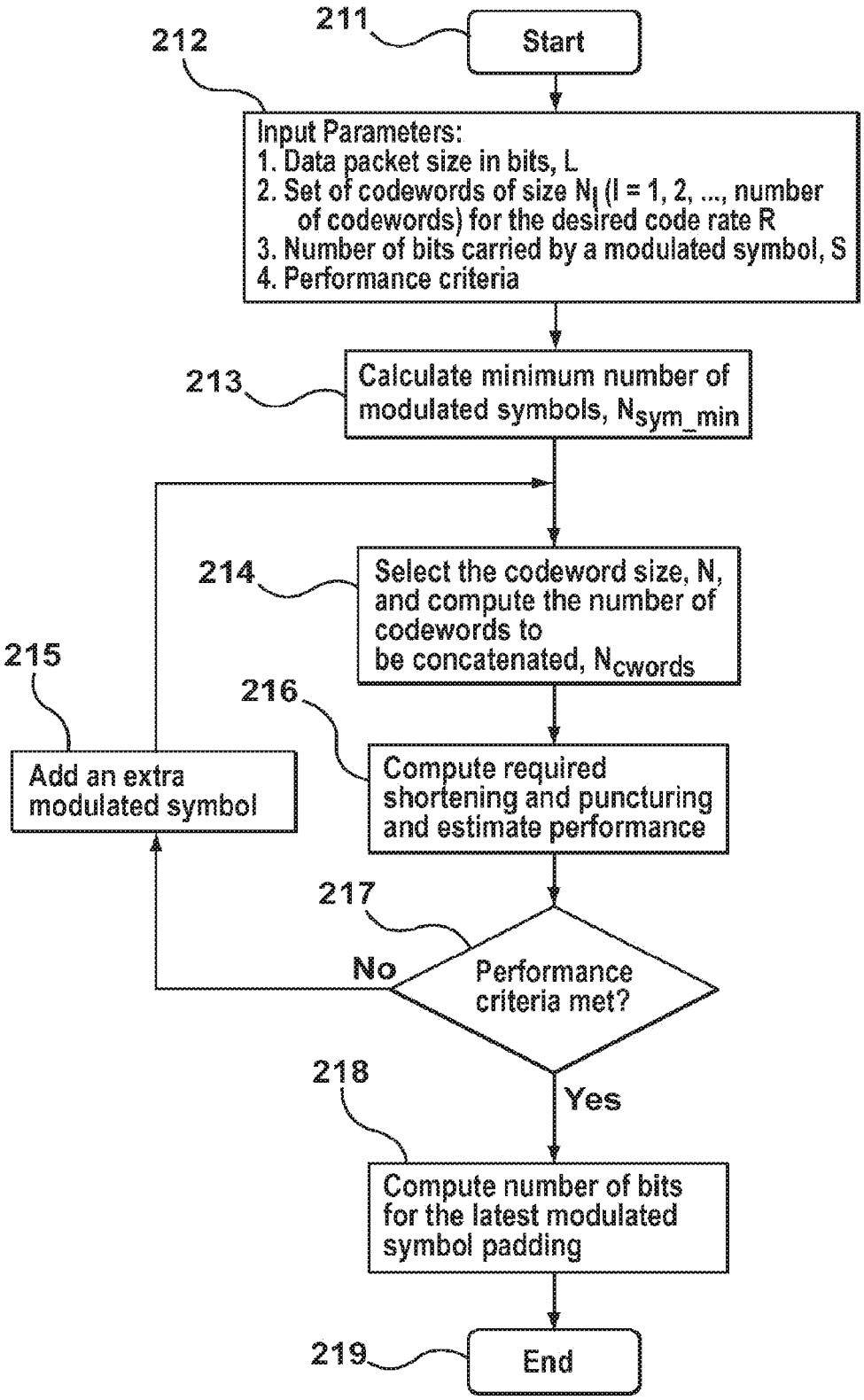
FIG. 21 illustrates a data encoding procedure in accordance with another embodiment of the present invention.

Referring to FIG. 21, these steps are more fully shown in the flow chart in which the process starts 211 and various parameters are input 212 including:

Data packet size in bits, L;

Set of codewords of size Ni (i=1, 2, . . . , number_of_codewords) for the derived code rate R;

Number of bits carried by a modulated symbol S; and

Performance criteria.

At step 213, the minimum number of modulated symbols $N_{sym_min}$ is calculated. Next at step 214, the codeword size N is selected, and the number of codewords to be concatenated $N_{cwords}$ is computed. At step 216 the required shortening and puncturing are computed, and performance estimated. If the performance criterion are met 217, the number of bits required to pad the last modulated symbol is computed 218 and the process ends 219. Where the performance criterion are not met 217, an extra modulated symbol is added 215 and the step 214 is reentered.

Both the encoder and the decoder may be presented with the same input parameters in order to be able to apply the same procedure and consequently use the same codeword size, as well as other relevant derived parameters, such as the amount of shortening and puncturing for each of the codewords, number of codewords, etc.

In some cases only the transmitter (encoder) has all the parameters available, and the receiver (decoder) is presented with some derived version of the encoding procedure parameters. For example, in some applications it is desirable to reduce the initial negotiation time between the transmitter and the receiver. In such cases the transmitter initially informs the receiver of the number of modulated symbols it is going to use for transmitting the encoded bits rather than the actual data packet size. The transmitter performs the encoding procedure differently taking into consideration the receiver's abilities (e.g. using some form of higher layer protocol for negotiation). Some of the requirements are relaxed in order to counteract deficiencies of the information at the receiver side. For example, the use of additional modulated symbols to enhance performance may always be in place, may be bypassed altogether, or may be assumed for the certain ranges of payload sizes, e.g. indirectly specified by the number of modulated symbols.

One example of such an encoding procedure is an OFDM based transceiver, which may be used in IEEE 802.11n. In this case the reference to the number of bits per modulated symbol translates into the number of bits per OFDM symbol. In this example, the AggregationFlag parameter specified in 801.11n is used to differentiate between the case when both the encoder and the decoder are aware of actual data packet size (AggregationFlag=0) and the case when the packet size is indirectly specified by the number of required OFDM symbols (AggregationFlag=1).

An exemplary algorithm in accordance with one embodiment of the present invention is with following parameters are now described:

Algorithm Parameters $NN_{max}$=2304, $NN_{min}$=576, $NN_{inc}$=576: maximum, minimum and increment of codeword lengths, effectively resulting 4 codeword lengths: 576, 1152, 1728, 2304;

$p_{max}$: maximum puncturing percentage, which is defined as:

number of punctured bits/total number of parity bits (%).

Algorithm Input

R: target code rate;

$N_{CBPS}$: number of data bits in OFDM symbol;

AggregationFlag: Boolean signaling whether PSDU is an aggregate of MPDUs (AggregationFlag=1), HT_LENGTH: number of payload octets (AggregationFlag=0), or number of OFDM symbols (AggregationFlag=1)

Algorithm Output:

NN: code length to use;

$N_{CodeWords}$: number of codewords to use;

$KK_S$,$KK_{S_Last}$: number of information bits to send in first codeword(s), and in last codeword;

$N_p$, $N_{p_Last}$: number of bits to puncture in first codeword (s), and in last codeword;

$N_{OFDM}$: number of OFDM symbols used;

$N_{PaddingBits}$: number of bits the last OFDM symbol is padded;

Algorithm Procedure

```
if(AggregationFlag == 0) {
  N_InfoBits=8×HT_LENGTH;
  // in non-aggregation case HT_LENGTH is the number of payload
  octets N_OFDM=ceil(N_InfoBits/(N_CBPS × R));
  // minimum number of OFDM symbols
}
 else {
  N_OFDM = HT_LENGTH;
  // in aggregation case HT_LENGTH is the number of OFDM symbols
  N_InfoBits = N_OFDM × N_CBPS × R;
  // number of info bits includes padding;MAC will use its own
  delineation
  //method to recover an aggregate payload
}
 N_CodeWords = ceil(N_CBPS× N_OFDM/ NN_max);
  // number of codewords is based on maximum codeword length
 NN = ceil(N_CBPS× N_OFDM/(N_CodeWords×NN_inc))× N_inc;
  // codeword length will be the larger of the closest one
  //to N_CBPS × N_OFDM/N_CodeWords
 KK=NN×R;
  // number of information bits in codeword chosen
MM=NN−KK;
  // number of parity bits in codeword chosen
N_ParityBits_requested =N_CodeWords× MM;
  // total number of parity bits allocated in N_OFDM symbols
N_ParityBits =min(N_OFDM× N_CRPS− N_InfoBits,N_ParityBits_requested);
  // in non-aggregation case allow adding extra OFDM symbol(s) to limit
    //puncturing
if(AggregationFlag==0) {
    while(100× (N_ParityBits_requested −N_ParityBits)/
    N_ParityBits_requested >P_max) {
      N_OFDM = N_OFDM+1;
    // extra OFDM symbol(s) are used to carry parity
    N_ParityBits = min(N_ParityBits + N_CBPS,N_ParityBits_requested);
    }
}
    // Finding number of information bits to be sent per codeword(s),
    //KK_S, KK_S_Last, and number of bits the codeword(s) will be punc-
tured
    N_P ,
    //and N_P_Last, Making sure that last codeword may only be shortened
    // more then others, and punctured less then others.
KK_S =ceil(N_InfoBits/ N_CodeWords);
KK_S_Last = N_InfoBits ~ KK_S × ( N_CodeWords −1);
MM_P =min(MM, floor(N_ParityBits/CodeWords);
MM_P_Last = min(MM, N_ParityBits − MM_P × (N_CodeWords − 1));
N_P =MM − MM_P;
N_P_Last =MM− MM_P_Last;
    // Finally, calculating number of padding bits in last OFDM symbol
N_PaddingBits = N_OFDM × N_CBPS − N_InfoBits −N_ParityBits;
```

Each of those features will be now described in more detail.

(a) General Rules for Shortening and Puncturing

Much effort has been spent to come up with designs of LDPC parity check matrices such that the derived codes provide optimum performance. Examples include: T. J. Richardson et al., "Design of Capacity-Approaching Irregular Length Low-Density Parity-Check Codes," IEEE Transactions on Information Theory, vol. 47, February 2001 and S. Y. Chung, et al., "Analysis of Sum-Product Decoding of Low-Density Parity-Check Codes Using a Gaussian Approximation," IEEE Transactions on Information Theory, vol. 47, February 2001, both of which are incorporated herein by reference, are examples. These papers show that, in order to provide optimum performance, a particular variable nodes degree distribution should be applied. Degree distribution refers here to the distribution of the column weights in a parity check matrix. This distribution, in general, depends on the code rate and the size of the parity check matrix, or codeword. It is desirable that the puncturing and shortening pattern, as well as the number of punctured/shortened bits, are specified in such a way that the variable nodes degree distribution is preserved as much as possible. However, since shortening and puncturing are qualitatively different operations, different rules apply to them, as will now be explained.

(b) Rules for Shortening

Shortening of a code is defined as sending less information bits than possible with a given code, K'<K. The encoding is performed by: taking K' bits from the information source, presetting the rest (K-K') of the information bit positions in the codeword to a predefined value, usually 0, computing M parity bits by using the full M×N parity check matrix, and finally forming the codeword to be transmitted by concatenating K' information bits and M parity bits. One way to determine which bits to shorten in the data portion of the parity check matrix, $H_d$ (31 in FIG. 3), is to define a pattern which labels bits to be shortened, given the parity check matrix, $H=[H_d|H_p]$. This is equivalent to removing corresponding columns from $H_d$. The pattern is designed such that the degree distribution of the parity check matrix after shortening, i.e. removing appropriate columns from $H_d$, is as close as possible to the optimal one for the new code rate and the codeword length. To illustrate this, consider a matrix having the following sequence of weights (each number corresponds to a column weight):

3 3 3 8 3 3 3 8 3 3 3 8

When discarding columns, the aim is to ensure that the ration of '3's to '8's remains close to optimal, say 1:3 in this case. Obviously it cannot be 1:3 when one to three columns are removed. In such circumstances, the removal of 2 columns might result in e.g.:

3 3 8 3 3 8 3 3 3 8 giving a ratio of ~1:3.3 and the removal of a third column—one with weight '8'—might result in:

3 3 3 3 8 3 3 3 8 thus preserving a ratio of 1:3.5, which is closer to 1:3 than would be the case where the removal of the third column with weight '3', which results in:

8 3 3 3 8 3 3 3 8 giving a ratio of 1:2.

It is also important to preserve approximately constant row weight throughout the shortening process.

Figure 22:
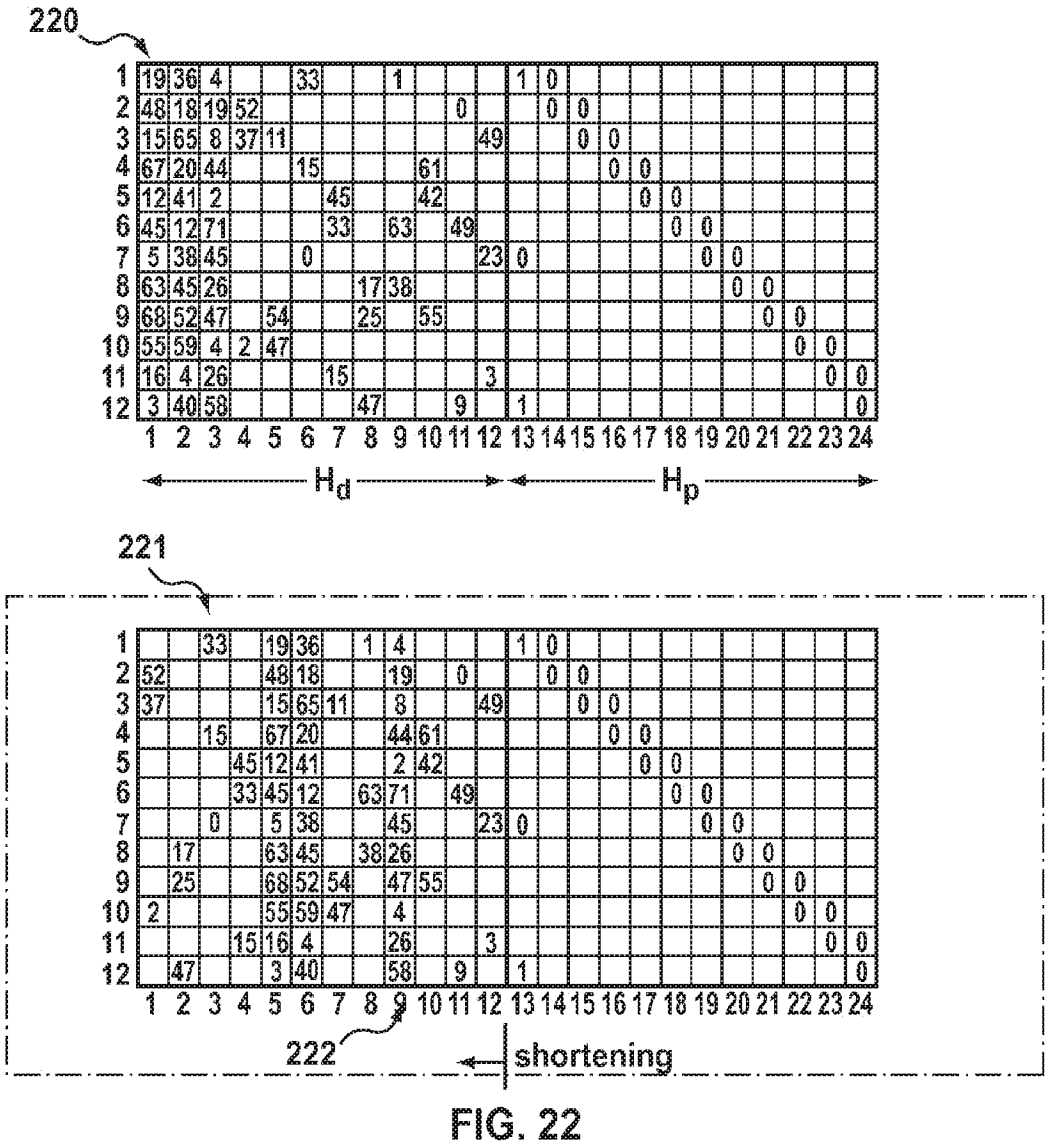
FIG. 22 illustrates rearranging of the columns in $H_d$ in order to enable efficient shortening.

An alternative to the above-described approach is to prearrange columns of the part of the parity check matrix, such that the shortening can be applied to consecutive columns in $H_d$. Although perhaps suboptimal, this method keeps the degree distribution of $H_d$ close to the optimum. However, the simplicity of the shortening pattern, namely taking out the consecutive columns of $H_d$, gives a significant advantage by reducing complexity. Furthermore, assuming the original matrix satisfies this condition, approximately constant row weight is guaranteed. An example of this concept is illustrated in FIG. 22 where the original code rate R=½ matrix 220 is shown. In FIG. 22 (and FIG. 25) the white squares represent a z x z zero matrix, whereas the gray squares represent a z×z identity matrix shifted circularly to the right a number of times specified by the number written in the middle of the corresponding gray square. In this particular case, the maximum expansion factor is: $z_{max}$=72.

After rearranging the columns of the $H_d$ part of the original matrix, the new matrix takes on the form 221 shown in FIG. 22. It can be seen that if the shortening is performed as indicated (to the left from the $H_d|H_p$ boundary) the density of the new $H_d$ will slightly increase until it reaches a "heavy" weight column (such as the block column 222). At that point the density of the new $H_d$ will again approach the optimum one. A person skilled in the art will note that the rearranging of the columns in $H_d$ does not alter the properties of the code.

In the case of a regular column parity check matrix, or more generally, approximately regular, or regular and approximately regular only in the data part of the matrix, $H_d$, the method described in the previous paragraph is still preferred compared to the existing random or periodic/random approach. The method described here ensures approximately constant row weight, which is another advantage from the performance and the implementation complexity standpoint.

(c) Puncturing

Puncturing of a code is defined as removing parity bits from the codeword. In a wider sense, puncturing may be defined as removing some of the bits, either parity bits or data bits or both, from the codeword prior to sending the encoded bits to the modulator block and subsequently over the channel. The operation of puncturing, increases the effective code rate. Puncturing is equivalent to a total erasure of the bits by the channel. The soft iterative decoder assumes a completely neutral value corresponding to those erased bits. In case that the soft information used by the decoder is the log-likelihood ratio, this neutral value is zero.

Figure 23:
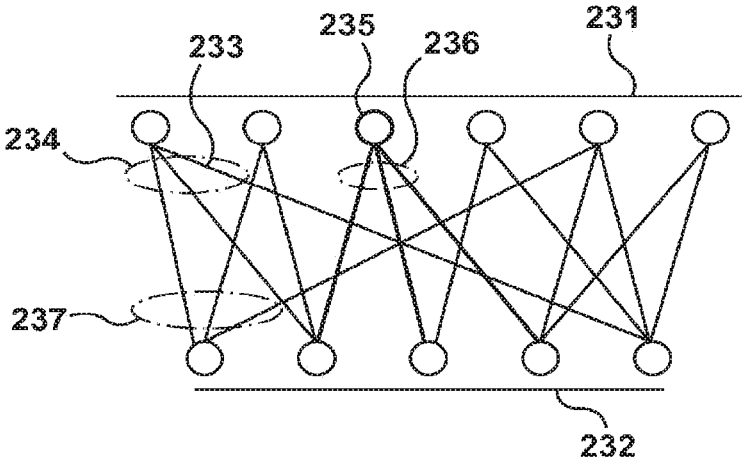
FIG. 23 shows a bipartite graph of an LDPC code with emphasis on a punctured bit.

Puncturing of LDPC codes can be given an additional, somewhat different, interpretation. An LDPC code can be presented in the form of the bipartite graph of FIG. 23, in which the codeword bits are presented by the variable nodes 231, and parity check equations by the check nodes 232.

Each variable node 231 is connected 234 by edges, for example 233, to all the check nodes 232 in which that particular bit participates. Similarly, each check node (corresponding to a parity check equation) is connected by a set of edges 237 to all variable nodes corresponding to bits participating in that particular parity check equation. If a bit is punctured, for example node 235, then all the check nodes connected to it, those connected by thicker lines 236, are negatively affected. Therefore, if a bit chosen for puncturing participates in many parity check equations, the performance degradation may be very high. On the other hand, since the only way that the missing information (corresponding to the punctured bits) can be recovered is from the messages coming from check nodes those punctured bits participate in, the more of those the more successful recovery may be. Faced with contradictory requirements, the optimum solution can be found somewhere in the middle. These general rules can be stated as following:

Bits selected for puncturing should be chosen such that each one is connected to as few check nodes as possible. This can be equivalently stated as follows: bits selected for puncturing should not be the ones corresponding to the heavy-weight, or strong columns, i.e. columns containing large number of non-zero elements, 1's in this particular case.

Bits selected for puncturing should be chosen such that they all participate in as many parity check equations as possible.

Figure 24:
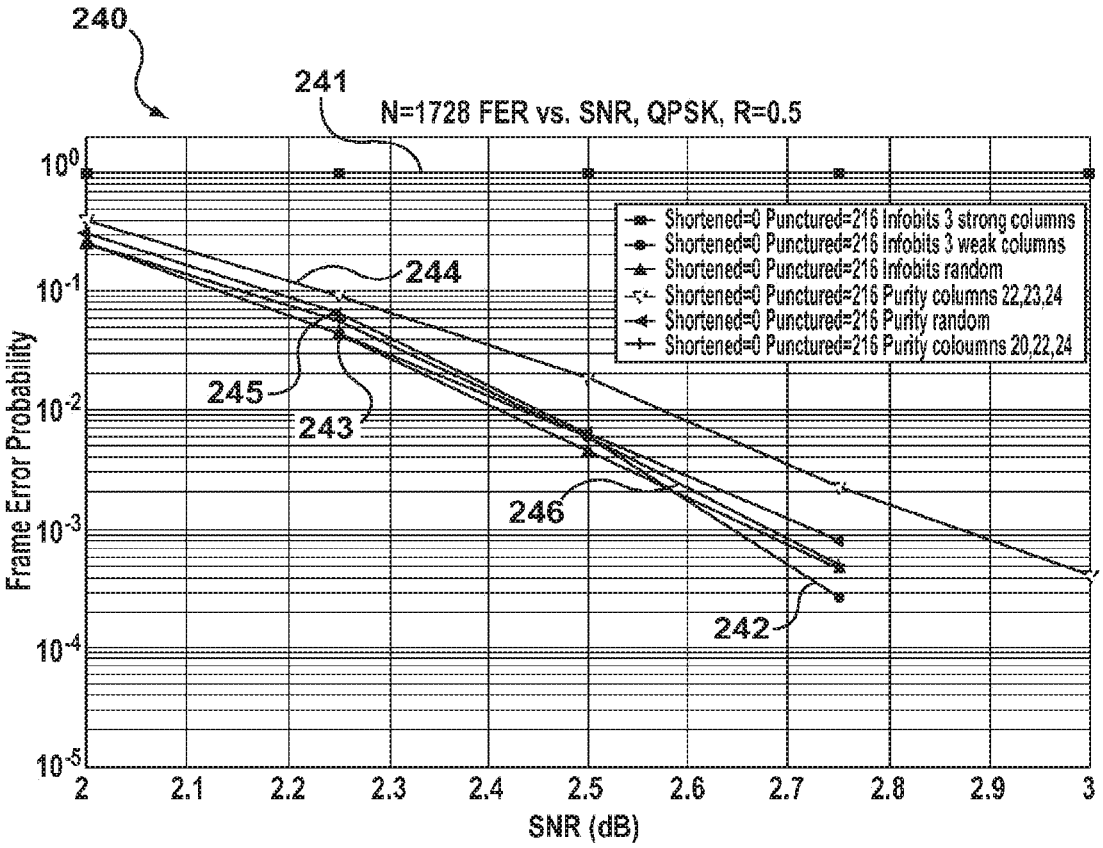
FIG. 24 illustrates puncturing impact on the performance.

Some of these trade-offs can be observed from FIG. 24 showing the frame error probability 240 for various situations.

FIG. 25 illustrates the base parity check matrix 250 used for obtaining the results in FIG. 24. The codeword size is 1728, which is obtained by expanding the base parity check matrix by the factor of z=72.

In FIG. 24, the curves are shown for six examples,

241: Shortened=0 Punctured=216 Infobits 3 strong columns

242: Shortened=0 Punctured=216 Infobits 3 weak columns

243: Shortened=0 Punctured=216 Infobits random

244: Shortened=0 Punctured=216 Parity columns 22, 23, 24

245: Shortened=0 Punctured=216 Parity random and

246: Shortened=0 Punctured=216 Parity columns 20, 22, 24

It can be seen from the FIG. 24 that puncturing bits corresponding to heavy-weight, or strong columns has a catastrophic effect on performance (241). On the other hand, puncturing block columns that do not participate in very many parity check equations does not provide very good performance (244) either. The best results are obtained when both criteria are taken into account represented by curves 242, 243, 245, 246. Among all of those, it appears that for the particular matrix structure (irregular $H_d$ part with the modified dual diagonal in the $H_p$ part) the best results were obtained when the punctured bits were selected from those corresponding to the weak columns of the data part of the parity check matrix, $H_d$, (242). If the parity check matrix is arranged as in 221 of FIG. 22, then the puncturing bits can be selected by starting from the leftmost bit of $H_d$ and continuing with consecutive bits towards the parity portion of the matrix.

The matrix in FIG. 25 has undergone column rearrangement such that all the light-weight data columns have been put in the puncturing zone, i.e. leftmost part of the $H_d$ part of the parity check matrix.

As discussed previously, in the case where the preservation of the exact code rate is not mandatory, the shortening-to-puncturing ratio can be chosen such that it guarantees preservation of the performance level of the original code. Normalizing the shortening-to-puncturing ratio, q, as follows:

$$q_{normalized}=(N_{shortened}/N_{punctured})/[R/(1-R)],$$

means that q becomes independent of the code rate, R. Therefore, $q_{normalized}=1$, corresponds to the rate preserving case of combined shortening and puncturing. However, if the goal is to preserve performance, this normalized ratio must be greater than one: $q_{normalized}>1$. It was found through much experimentation that one: $q_{normalized}$ in the range of 1.2-1.5 complies with the performance preserving requirements.

In the case of a column regular parity check matrix, or more generally, approximately regular, or regular and approximately regular only in the data part of the matrix, $H_d$ the method described above in accordance with one embodiment of the present invention is still preferred compared to the existing random or periodic/random approach since the present invention ensures approximately constant row weight, which provides another advantage from both the performance and the implementation complexity standpoints.

A large percentage of punctured bits paralyzes the iterative soft decision decoder. In the case of LDPC codes this is true even if puncturing is combined with some other operation such as shortening or extending the code. One could conclude this by studying the matrix 250 of FIG. 25. Here, it can be seen that as puncturing progresses it is more and more likely that a heavy weight column will be hit. This is undesirable and has a negative effect on the code performance. Defining the puncturing percentage as:

$$P_{puncture}=100\times(N_{puncture}/M),$$

then it can be seen that the matrix 250 from FIG. 25 cannot tolerate puncturing in excess of $P_{puncture_max}$=33.3%. Therefore, this parameter $P_{puncture_max}$ must be set and taken into account when performing the combined shortening and puncturing operation.

Some of the embodiments of the present invention may include the following characteristics:

- Shortening, or combined shortening and puncturing is applied in order to provide a large range of codeword sizes from a single parity check matrix.
- The effective code rate of the code defined by the parity check matrix modified by shortening and puncturing is equal to or less than the original code rate.
- Shortening is performed so that the column weight distribution of the modified matrix is optimal for the new matrix size and code rate. Another solution is to keep the column weight distribution of the new matrix only approximately optimum.
- Shortening is performed so that the approximately uniform row weight is preserved.
- Puncturing is performed so that each of the bits selected for puncturing is connected to as few check nodes as possible.
- Puncturing is performed so that the bits selected for puncturing all participate in as many parity check equations as possible.
- Puncturing is performed so that the approximately uniform row weight is preserved.
- A suboptimal but computationally efficient method is to first rearrange the columns of the data portion of the parity check matrix, $H_d$, by applying the preceding rules assuming that shortening is applied to a group of consecutive bits of the data portion of the parity check matrix and puncturing is applied to another group of consecutive bits of the data portion of the parity check matrix as illustrated by the example matrix 250 shown in FIG. 25.
- Performance of the new code, which is obtained by applying both the shortening and puncturing, can be kept at the level of the original code by setting the normalized shortening to puncturing ratio, $q_{normalized}=(N_{shortened}/N_{punctured})/[R/(1-R)]$ greater than one. The $q_{normalized}$ value depends on the particular matrix design and the code rate, R. When the preservation of the original code rate is required, the normalized shortening to puncturing ratio shall be set to one ($q_{normalized}=1$).
- The amount of puncturing is limited to a certain value, which depends on the particular parity check matrix design.

The system, apparatus, and method as described above are preferably combined with one or more matrices shown in the FIGS. 26a, 26b and 26c that have been selected as being particularly suited to the methodology. They may be used alone, or with other embodiments of the present invention.

The matrices in FIGS. 26a, 26b and 26c have been derived and tested, and have proven to be at least as efficient as prior art matrices in correcting errors.

A first group of matrices (FIG. 26a #1-#5) cover expansion factors up to 72 using rates R=½, ⅔, ¾, ⅚, and ⅞, respectively. The matrices may be utilized as they are specified or with the columns in the data portion of any of the matrices (first R*24 columns on the left side) reordered in anyway. The parity portion ((1−R)*24 rightmost columns) of the matrices is designed to allow simple encoding algorithms. They may be used in standards, such as wireless standards IEEE 802.11, and IEEE 802.16.

A further matrix (FIG. 26b #6) covers expansion factors up to 96 for rate R=¾. The matrix may be utilized as it is or with the columns in the data portion (first R*24 columns on the left side) reordered in any way. The parity portion ((1−R)*24 rightmost columns) of the matrix is designed to allow simple encoding algorithms.

The rate R=¾ matrices (FIG. 26b #7-#9) cover expansion factors in the range between 24 and 96 in increments of 4.

The rate R=⅚ matrix (FIG. 26b #10) may be used to cover expansion factors in the range between 24 and 96 in increments of 4.

The two rate R=⅚ matrices (FIGS. 26c #11 and #12) cover expansion factors up to $L_{max}$=96. The matrices may be utilized as they are or with the columns in the data portion (first R*24 columns on the left side) reordered in any way. The parity portion ((1−R)*24 rightmost columns) of the matrix is designed to allow simple encoding algorithms. These particular matrices can accommodate codeword sizes in the range 576 to 2304 in increments of 96. Consequently, the expansion factors, L are in the range 24 to 96 in increments of 4. Right circular shifts of the corresponding L×L identity matrix (as explained in the previous section), s', are determined as follows:

$$s'=\text{floor}\{s.\ (L/96)\},$$

where s is the right circular shift corresponding to the maximum codeword size (for L=Lmax=96), and it is specified in the matrix definitions.

The invention can be implemented in digital electronic circuitry, or in computer hardware, firmware, software, or in combinations thereof. Apparatus of the invention can be implemented in a computer program product tangibly embodied in a machine-readable storage device for execution by a programmable processor; and method actions can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits). Further, a computer data signal representing the software code which may be embedded in a carrier wave may be transmitted via a communication network. Such a computer readable memory and a computer data signal are also within the scope of the present invention, as well as the hardware, software and the combination thereof.

While particular embodiments of the present invention have been shown and described, changes and modifications may be made to such embodiments without departing from the true scope of the invention.

What is claimed is:

[1. A method of low-density parity-check (LDPC) encoding data, comprising:

receiving input data from a data source; and applying the following expanded parity check matrix to the input data to generate encoded data:

| | | | | | | | | | | | |
|---|---|---|---|---|---|---|---|---|---|---|---|
| 6 | 38 | 3 | 93 | −1 | −1 | −1 | 30 | 70 | −1 | 86 | −1 |
| 62 | 94 | 19 | 84 | −1 | 95 | 78 | −1 | 15 | −1 | −1 | 92 |
| 71 | −1 | 55 | −1 | 12 | 66 | 45 | 79 | −1 | 78 | −1 | −1 |

-continued

| | | | | | | | | | | | |
|---|---|---|---|---|---|---|---|---|---|---|---|
| 38 | 61 | −1 | 66 | 9 | 73 | 47 | 64 | −1 | 39 | 61 | 43 |
| −1 | −1 | −1 | −1 | 32 | 52 | 55 | 80 | 95 | 22 | 6 | 51 |
| −1 | 63 | 31 | 88 | 20 | −1 | −1 | −1 | 6 | 40 | 66 | 16 |
| 37 | 38 | 4 | 11 | −1 | 46 | 48 | 0 | −1 | −1 | −1 | −1 |
| −1 | 45 | 24 | 32 | 30 | −1 | −1 | 0 | 0 | −1 | −1 | −1 |
| 10 | −1 | 22 | 55 | 70 | 82 | −1 | −1 | 0 | 0 | −1 | −1 |
| −1 | −1 | −1 | −1 | 95 | 32 | 0 | −1 | −1 | 0 | 0 | −1 |
| 24 | 90 | 44 | 20 | −1 | −1 | −1 | −1 | −1 | −1 | 0 | 0 |
| 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96).]

[2. A method of decoding low-density parity-check (LDPC) encoded data, comprising:

receiving encoded data from a data source; and applying the following expanded parity check matrix to the encoded data to generate decoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96).]

[3. Apparatus for low-density parity-check (LDPC) encoding data, comprising:

an input port operable to receive input data from a data source; and circuitry coupled to the input port and operable to apply the following expanded parity check matrix to the input data to generate encoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96).]

[4. Apparatus for low-density parity-check (LDPC) encoding data, comprising:

an input port operable to receive input data from a data source; and a matrix application element operable to apply the following expanded parity check matrix to the input data to generate encoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |

-continued

| | | | | | | | | | | | | | | | | | | | | | | | |
|---|---|---|---|---|---|---|---|---|---|---|---|---|---|---|---|---|---|---|---|---|---|---|---|
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96).]

[5. Apparatus for low-density parity-check (LDPC) encoding data, comprising:

an input port operable to receive input data from a data source; and means for applying the following expanded parity check matrix to the input data to generate encoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96).]

[6. Apparatus for decoding low-density parity-check (LDPC) encoded data, comprising:

an input port operable to receive encoded data from a data source; and circuitry coupled to the input port and operable to apply the following expanded parity check matrix to the encoded data to generate decoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96).]

[7. Apparatus for decoding low-density parity-check (LDPC) encoded data, comprising:

an input port operable to receive encoded data from a data source; and a matrix application element operable to apply the following expanded parity check matrix to the encoded data to generate decoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96).]

[8. Apparatus for decoding low-density parity-check (LDPC) encoded data, comprising:

an input port operable to receive encoded data from a data source; and means for applying the following expanded parity check matrix to the encoded data to generate decoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96).]

[9. A telecommunications network, comprising:

an LDPC encoder operable to apply the following expanded parity check matrix to input data to generate encoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96);

a transmitter operable to transmit the encoded data over a transmission medium;

a receiver operable to receive the transmitted encoded data; and an LDPC decoder operable to apply said expanded parity check matrix to the encoded data to recover the input data.]

[10. A method of operating a telecommunications network, comprising:

applying the following expanded parity check matrix to input data to generate encoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96);

transmitting the encoded data over a transmission medium;

receiving the transmitted encoded data; and applying said expanded parity check matrix to the encoded data to recover the input data.]

[11. A transceiver, comprising:

an LDPC encoder operable to apply the following expanded parity check matrix to input data to generate encoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96);

a transmitter operable to transmit the encoded data over a transmission medium;

a receiver operable to receive encoded data from the transmission medium; and an LDPC decoder operable to apply said expanded parity check matrix to the received encoded data to generate decoded data.]

[12. A method of operating a transceiver, comprising:

applying the following expanded parity check matrix to input data to generate encoded data:

| | | | | | | | | | | | | | | | | | | | | | | | |
|---|---|---|---|---|---|---|---|---|---|---|---|---|---|---|---|---|---|---|---|---|---|---|---|
| 6 | 38 | 3 | 93 | −1 | −1 | −1 | 30 | 70 | −1 | 86 | −1 | 37 | 38 | 4 | 11 | −1 | 46 | 48 | 0 | −1 | −1 | −1 | −1 |
| 62 | 94 | 19 | 84 | −1 | 95 | 78 | −1 | 15 | −1 | −1 | 92 | −1 | 45 | 24 | 32 | 30 | −1 | −1 | 0 | 0 | −1 | −1 | −1 |
| 71 | −1 | 55 | −1 | 12 | 66 | 45 | 79 | −1 | 78 | −1 | −1 | 10 | −1 | 22 | 55 | 70 | 82 | −1 | −1 | 0 | 0 | −1 | −1 |
| 38 | 61 | −1 | 66 | 9 | 73 | 47 | 64 | −1 | 39 | 61 | 43 | −1 | −1 | −1 | −1 | 95 | 32 | 0 | −1 | −1 | 0 | 0 | −1 |
| −1 | −1 | −1 | −1 | 32 | 52 | 55 | 80 | 95 | 22 | 6 | 51 | 24 | 90 | 44 | 20 | −1 | −1 | −1 | −1 | −1 | −1 | 0 | 0 |
| −1 | 63 | 31 | 88 | 20 | −1 | −1 | −1 | 6 | 40 | 66 | 16 | 71 | 53 | −1 | −1 | 27 | 26 | 48 | −1 | −1 | −1 | −1 | 0 |

wherein an expansion factor, L, is between 24 and 96, −1 represents an L×L all-zero square matrix, and any other integer, Sij, represents an L×L identity matrix circularly right shifted by a shift amount equal to floor ((L×Sij)/96);

transmitting the encoded data over a transmission medium;

receiving encoded data from the transmission medium; and applying said expanded parity check matrix to the received encoded data to generate decoded data.]

*13. A method to operate a wireless device to encode data using low-density parity-check (LDPC) encoding, the method comprising:*

*computing a number of modulated orthogonal frequency-division multiplexing (OFDM) symbols for transmitting the data;*

*computing a number of shortening bits $N_{shortened}$ for at least one LDPC codeword to be used during an encoding;*

*distributing the number of shortening bits $N_{shortened}$ over the at least one LDPC codeword;*

*computing a number of puncturing bits $N_{punctured}$ for the at least one LDPC codeword;*

*distributing the number of puncturing bits over the at least one LDPC codeword;*

*determining a criterion using at least one of the number of shortening bits $N_{shortened}$ and the number of puncturing bits $N_{punctured}$;*

*if the criterion is met, increasing the number of modulated OFDM symbols and recalculating the number of puncturing bits $N_{punctured}$;*

*generating the encoded data using the number of shortening bits $N_{shortened}$, the number of puncturing bits $N_{punctured}$, and the at least one LDPC codeword, wherein shortening is performed by setting $N_{shortened}$ information bits to 0 within the at least one LDPC codeword, and puncturing is performed by discarding $N_{punctured}$ parity bits from the at least one LDPC codeword; and*

*transmitting the encoded data.*

*14. The method of claim 13, wherein the criterion is determined using both the number of shortening bits $N_{shortened}$ and the number of puncturing bits $N_{punctured}$.*

*15. The method of claim 13, further comprising computing a number of the at least one LDPC codeword to encode the data and a length of each of the at least one LDPC codeword.*

*16. The method of claim 13, wherein transmitting the encoded data comprises transmitting the encoded data using the number of modulated OFDM symbols.*

*17. A wireless device comprising:*

*a low-density parity-check (LDPC) encoder circuit configured to:*

*compute a number of modulated orthogonal frequency-division multiplexing (OFDM) symbols for transmitting data;*

*compute a number of shortening bits $N_{shortened}$ for at least one LDPC codeword to be used during an encoding;*

*distribute the number of shortening bits $N_{shortened}$ over the at least one LDPC codeword;*

*compute a number of puncturing bits $N_{punctured}$ for the at least one LDPC codeword;*

*distribute the number of puncturing bits over the at least one LDPC codeword;*

*determine a criterion using at least one of the number of shortening bits $N_{shortened}$ and the number of puncturing bits $N_{punctured}$;*

*if the criterion is met, increase the number of modulated OFDM symbols and recalculate the number of puncturing bits $N_{punctured}$; and*

*generate the encoded data using the number of shortening bits $N_{shortened}$, the number of puncturing bits $N_{punctured}$, and the at least one LDPC codeword,*

*wherein shortening is performed by setting $N_{shortened}$ information bits to 0 within the at least one LDPC codeword, and puncturing is performed by discarding $N_{punctured}$ parity bits from the at least one LDPC codeword; and*

*a transmitter configured to transmit the encoded data.*

*18. The wireless device of claim 17, wherein the criterion is determined using both the number of shortening bits $N_{shortened}$ and the number of puncturing bits $N_{punctured}$.*

*19. The wireless device of claim 17, wherein the LDPC encoder circuit is further configured to compute a number of the at least one LDPC codeword to encode the data and a length of each of the at least one LDPC codeword.*

*20. The wireless device of claim 17, wherein the transmitter is configured to transmit the encoded data using the number of modulated OFDM symbols.*

*21. A non-transitory computer readable medium comprising instructions that when executed by a wireless device cause the wireless device to perform steps of a method to encode data using low-density parity-check (LDPC) encoding, the method comprising:*

*computing a number of modulated orthogonal frequency-division multiplexing (OFDM) symbols for transmitting the data;*

*computing a number of shortening bits $N_{shortened}$ for at least one LDPC codeword to be used during an encoding;*

*distributing the number of shortening bits $N_{shortened}$ over the at least one LDPC codeword;*

*computing a number of puncturing bits $N_{punctured}$ for the at least one LDPC codeword;*

*distributing the number of puncturing bits over the at least one LDPC codeword;*

*determining a criterion using at least one of the number of shortening bits $N_{shortened}$ and the number of puncturing bits $N_{punctured}$;*

*if the criterion is met, increasing the number of modulated OFDM symbols and recalculating the number of puncturing bits $N_{punctured}$;*

*generating the encoded data using the number of shortening bits $N_{shortened}$, the number of puncturing bits $N_{punctured}$, and the at least one LDPC codeword, wherein shortening is performed by setting $N_{shortened}$ information bits to 0 within the at least one LDPC codeword, and puncturing is performed by discarding $N_{punctured}$ parity bits from the at least one LDPC codeword; and*

*transmitting the encoded data.*

*22. The non-transitory computer readable medium of claim 21, wherein the criterion is determined using both the number of shortening bits $N_{shortened}$ and the number of puncturing bits $N_{punctured}$.*

*23. The non-transitory computer readable medium of claim 21, wherein the method further comprises computing a number of the at least one LDPC codeword to encode the data and a length of each of the at least one LDPC codeword.*

*24. The non-transitory computer readable medium of claim 21, wherein transmitting the encoded data comprises transmitting the encoded data using the number of modulated OFDM symbols.*

* * * * *